United States Patent [19]

Lehmann

[11] 4,054,785
[45] Oct. 18, 1977

[54] SPECTRUM ANALYZER WITH MULTIPLE OPERATIONAL MODES

[75] Inventor: Joseph L. Lehmann, Sarasota, FL
[73] Assignee: Sangamo Weston, Inc., Sarasota, Fla.
[21] Appl. No.: 723,785
[22] Filed: Sept. 16, 1976
[51] Int. Cl.² .............................................. G06F 15/34
[52] U.S. Cl. ................................ 364/726; 324/77 D; 364/715
[58] Field of Search .............. 235/156, 152; 324/77 B, 324/77 D; 343/5 DP, 5 SA

[56] References Cited

U.S. PATENT DOCUMENTS

| 3,737,900 | 6/1973 | Yehrs, Jr. ...................... 343/5 DP X |
| 3,932,737 | 1/1976 | Delepine .............................. 235/152 |
| 3,935,437 | 1/1976 | Schmitt ................................ 235/152 |

*Primary Examiner*—David H. Malzahn
*Attorney, Agent, or Firm*—W. R. Sherman; Kevin McMahon; I. S. Kavrukov

[57] ABSTRACT

Disclosed is a fully digital spectrum analyzer which includes a digital frequency translator that makes it possible to effectively analyze frequency bands that do not start at zero frequency. With the translator, the available spectral lines can be within the band of interest and not wasted in the range from zero frequency to the start of the band, and as a result the band is examined at optimal resolution. The translation takes place after the signal to be analyzed has been digitized, and the translator time-shares much of the conventional circuitry of the spectrum analyzer, to thereby minimize the cost of translation. Additionally, the spectrum analyzer includes an analog network that reduces the frequency of very fast signals so they can be analyzed by a spectrum analyzer having a relatively low upper frequency limit.

10 Claims, 14 Drawing Figures

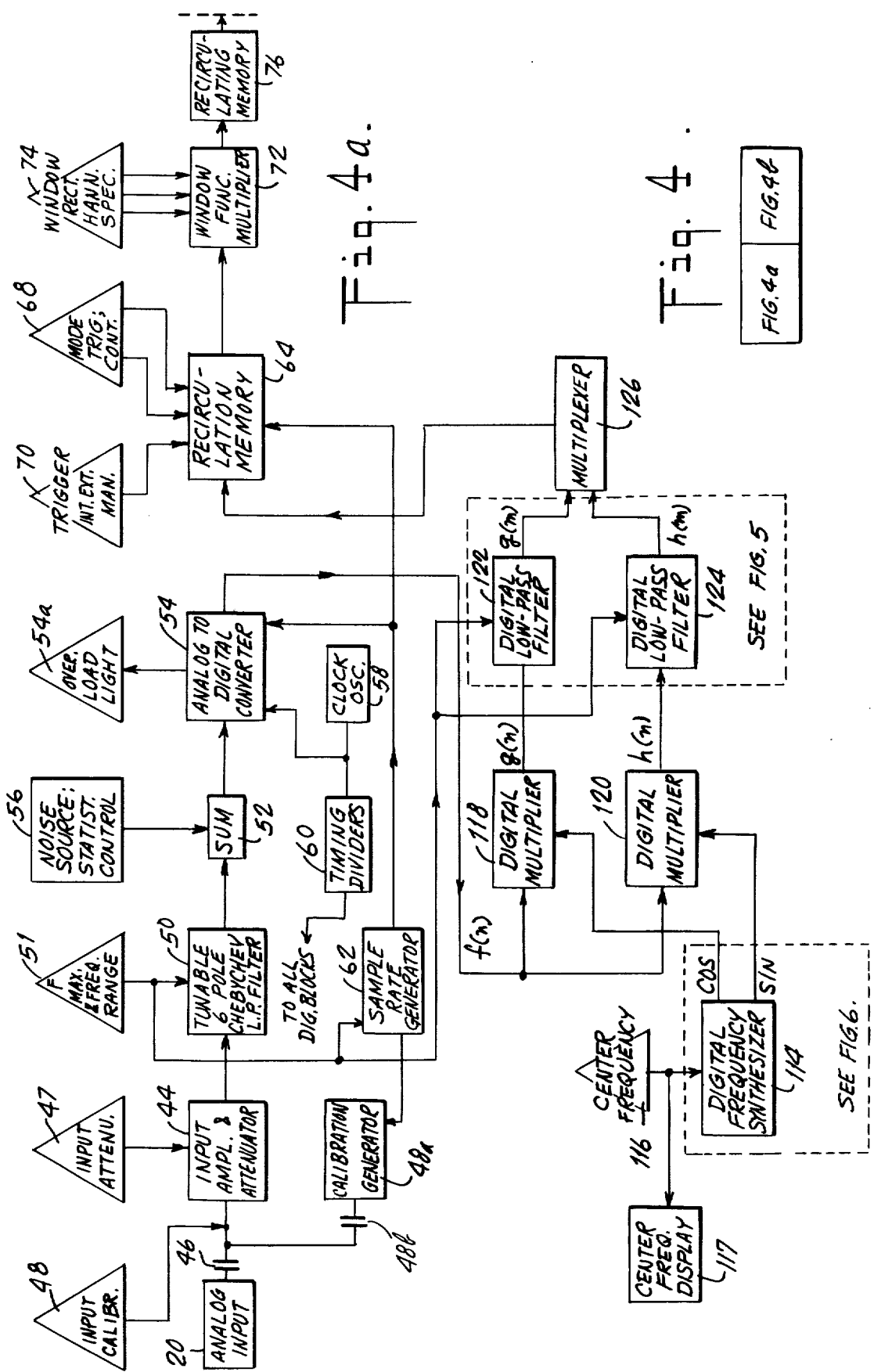

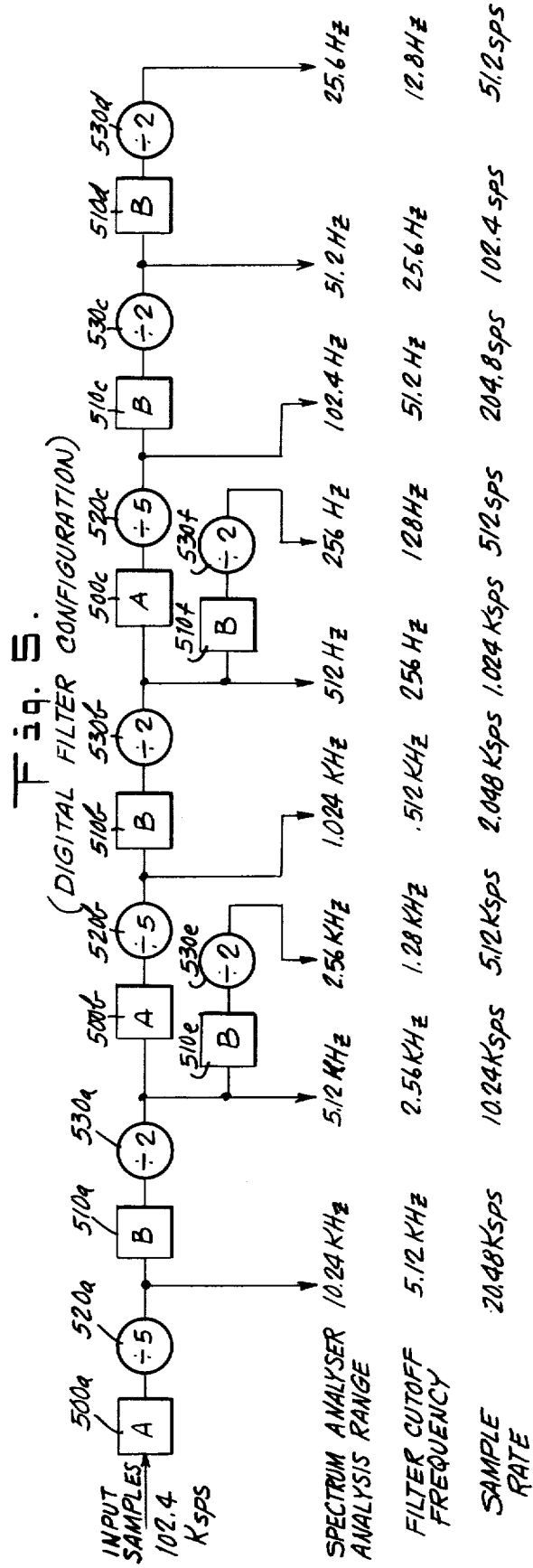
Fig. 5. (DIGITAL FILTER CONFIGURATION)
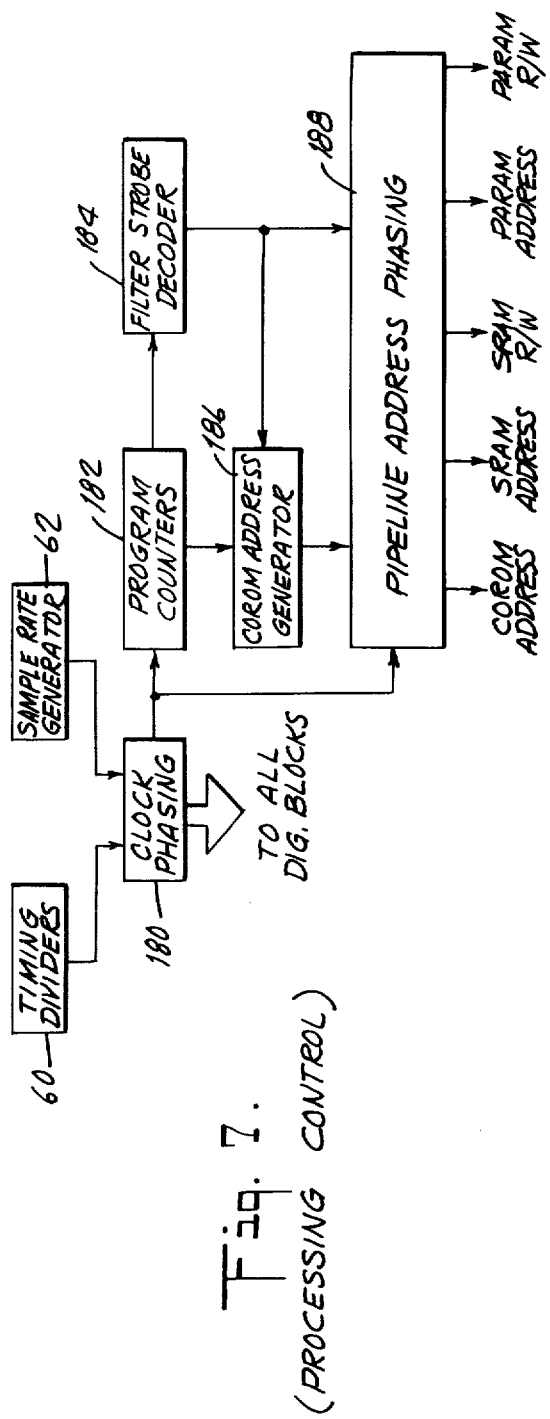
Fig. 7. (PROCESSING CONTROL)

(DIGITAL FREQUENCY SYNTHESIS)

(DIGITAL DATA PROCESSING)

(ANALOG TRANSLATION)

(HARMONIC SEQUENCE CONTROL)

Fig. 11.
(TIMING SEQUENCE)

| DATA SAMPLE # | $m$ | | | | $m+1$ | | | |
|---|---|---|---|---|---|---|---|---|
| DFT MEMORY | $h(2m)$ | | $g(2m+1)$ | | $h[2(m+1)]$ | | $g[2(m+1)+1]$ | |
| N CLOCK | 1 | 0 | 1 | 0 | 1 | 0 | 1 | 0 |
| M CLOCK | 1 | 1 | 0 | 0 | 1 | 1 | 0 | 0 |
| TRIG FUNCTION | sin(arg) | cos(arg) | sin(arg) | cos(arg) | sin(arg) | cos(arg) | sin(arg) | cos(arg) |
| ARG | $\frac{2\pi}{M}mK$ | $\frac{2\pi}{M}mK$ | $\frac{2\pi}{M}mK$ | $\frac{2\pi}{M}mK$ | $\frac{2\pi}{M}(m+1)K$ | $\frac{2\pi}{M}(m+1)K$ | $\frac{2\pi}{M}(m+1)K$ | $\frac{2\pi}{M}(m+1)K$ |
| ACCUM. REG. (PRODUCT OF DFT MEMORY & TRIG. FUNCTION) | R | I | I | R | R | I | I | R |
| SIGN INVERSION LOWER SIDE BAND | 0 | 0 | 1 | 0 | 0 | 0 | 1 | 0 |
| UPPER SIDE BAND | 1 | 0 | 0 | 0 | 1 | 0 | 0 | 0 |

SPECTRUM ANALYZER WITH MULTIPLE OPERATIONAL MODES

BACKGROUND AND SUMMARY OF THE INVENTION

The invention is in the field of spectrum analyzers and specifically spectrum analyzers which have provisions for changing the frequency characteristics of the input signal such that it can be analyzed with greater resolution or more effectively than with more conventional spectrum analyzers. A fully digital spectrum analyzer of a type to which the invention pertains is disclosed in Lehmann et al., U.S. Pat. No. 3,881,097, which is hereby incorporated by reference here, and this invention is an improvement over spectrum analyzers of that type.

In the patented Lehmann et al. spectrum analyzer, and in other similar analyzers, an input signal is analyzed by finding its power spectrum at each of a given number of spectral lines which are uniformly distributed in the frequency range from zero to the maximum frequency of interest. For example, if the maximum frequency of interest in the input signal is 25.6 KHz and the spectrum analyzer has 256 spectral lines, the spectral lines are spaced by 100 Hz intervals, i.e., the resolution of the spectrum analyzer is 100 Hz. If the entire band from zero Hz to a given upper limit is of interest, then the 256 spectral lines are distributed optimally; however, if only a band starting above zero Hz is of interest, say if only the band from 12.2 KHz to 13.2 KHz is of interest, then that band is covered by only 10 spectral lines while the results for the remaining 246 available spectral lines are not used. It is desirable therefore to shift such band of interest down on the frequency scale so that it would start from zero Hz and the spectral lines can be efficiently distributed only or primarily within the band of interest.

It is known in the prior art to shift a frequency band that starts and ends at a non-zero frequency to a shifted band that starts at zero frequency. For example, Lathi, B.P., *Communication Systems,* Wiley, 1968, discusses at pages 179-184 an analog technique of generating a single sideband which has the effect of shifting a frequency band that starts at a non-zero frequency to a shifted band starting at zero frequency. A similar analog technique is used to shift a frequency band prior to applying it to a spectrum analyzer in Murtin, U.S. Pat. No. 3,634,760. It is also known to use certain digital techniques for effecting similar frequency shifts, and a digital technique relying on shifting which is matched to fast Fourier transform analysis is believed used in a spectrum analyzer sold by Sanders Associates, Inc. under the name S.A.-240. A technique which may have a similar effect of generating a single sideband, but which used processing based on Hilbert transforms, is disclosed in White, U.S. Pat. No. 3,800,131.

The analog techniques for shifting a frequency band described above may not be sufficiently accurate for a spectrum analyzer having certain minimum accuracy requirements, and it is desirable therefore to use digital techniques. However, the digital techniques for shifting a frequency band described above are matched to a spectrum analyzer using fast Fourier, Hilbert or similar transforms, and are not suited for other spectrum analyzers, such as the one disclosed in said Lehmann et al. patent, which use a discrete Fourier transform technique differing from the fast Fourier or Hilbert transform techniques in some respects which are important to the task of frequency band shifting. For example, while fast Fourier transform processors can receive the complex input (having real and imaginary parts) which results from the prior art shifting described above, a discrete Fourier transform processor of the type used in said Lehamnn et al. patent is suitable for only a real input. Accordingly, one aspect of the invention is to provide a spectrum analyzer in which a frequency band is shifted or translated by digital techniques which can work with a discrete Fourier transform processor rather than only with fast Fourier or similar transform processors.

The prior art spectrum analyzers referred to above are believed to do the frequency translation by processing circuits dedicated to that task, and to do it before the signal reaches the spectrum analyzer proper. In contrast, the invented analyzer does the frequency shift or translation to a substantial degree in the spectrum analyzer and by components which are time-shared for the tasks of frequency translation and conventional spectrum analysis, thus reducing the cost of providing for frequency translation capabilities.

Another type of modifying the frequency characteristics of a signal to be analyzed is used when the signal extends over a frequency range greater than the upper frequency limit for which the spectrum analyzer is designed. For example, if the spectrum analyzer is designed such that the maximum input frequency it can accept is 25.6 KHz, it can not accurately analyze signals which have a frequency of interest in excess of that limit. One technique for accommodating such fast input signal is to time-stretch the input signal, for example by sampling the fast input signal and deriving a time-stretched analog version of the sampled signal for feeding to the spectrum analyzer, as disclosed in detail in U.S. Pat. No. 3,969,705 issued on July 13, 1976 in the name of William N. Waggener and assigned to the same assignee as the invention here. The technique of the Waggener patent involves the use of a storage device, such as a charge transfer device serving as an analog delay line, and the use of circuitry for reading samples into the storage device at a high rate and reading the samples out of the storage device and into the spectrum analyzer at a low rate. While the technique is useful, the invention here has a corresponding provision for analyzing fast analog signals by changing them to a lower frequency content by a different, primarily analog technique.

In an exemplary embodiment of the invention, the spectrum analyzer can work in a first mode which is as described in said Lehmann et al patent. In this first mode, the analyzer converts an input analog signal to digital samples, multiplies the digital samples by selected trigonometric coefficients in a discrete Fourier transform (DFT) processor so as to generate DFT representations of the sampled signal, and then uses the discrete Fourier transform representations to calculate the power values for a set of spectral lines. Additionally, when it is desired to translate the frequency band of interest of the input signal, the spectrum analyzer operates in a second mode and uses much of the same discrete Fourier transform processor, on time-shared basis, to obtain discrete Fourier transform representations which correspond to a frequency band of the same width as the original frequency band of interest but translated to a zero center frequency. Still additionally, when it is desired to analyze a fast signal whose upper frequency limit is above the normal frequency limit of the spectrum analyzer, the spectrum analyzer works in a third mode to shift the frequencies of interest in the fast signal to lower frequencies, by primarily analog techniques, so that the originally fast signal can be effectively analyzed within the normal range of the spectrum analyzer.

More specifically, the spectrum analyzer provides a sequence of digital words, $f(n)$, where each word is the $n$-th sample of N successive samples of the analog signal which is being analyzed ($n = 1, 2, ..., N$). In the second mode, the digital words, $f(n)$, are multiplied by selected trigonometric functions to provide corresponding sequences of digital words, $g(n)$ and $h(n)$, resulting respectively from combining the word $f(n)$ with corresponding first trigonometric functions of arguments including a value representing the center frequency of the frequency band of interest and corresponding second trigonometric functions of arguments including a value representing the same center frequency. The first and second trigonometric functions are in quadrature relationship with each other. The sequences of words $g(n)$ and $h(n)$ are filtered digitally to provide a sequence of words $g(m)$ and a sequence of words $h(m)$, where $m = 1, 2, ..., M$ and $M < N$. As one example, $N = 25,600$ ($= 50 \times 512$) and $M = 512$. The spectrum analyzer includes a discrete Fourier transform processor which receives the words $g(m)$ and $h(m)$ and processes them to provide for each spectral line $k$ of K/2 spectral lines (where $k = 1, 2, ..., K/2$, and K is, for example, 256), a word RG and a word IG, where the RG word is the real part of the discrete Fourier transform of the words $g(m)$ and the IG word is the imaginary part of the discrete Fourier transform of the same words $g(m)$ for the spectral line $k$. The discrete Fourier transform processor further provides, for each spectral line $k$, a word RH and a word IH, where RH and IH are respectively the real and imaginary parts of the discrete Fourier transforms of the words $h(m)$ for the spectral line $k$. For each spectral line $k$, the corresponding RG and IH words are combined to produce a word RU, and the corresponding IG and RH words are combined to produce a word IU, where the words RU and IU are respectively the real and imaginary parts of the upper sideband of the selected frequency band translated about zero. Additionally, for each of the spectral lines $k$ the corresponding RG and IH words are combined to produce a word RL and the corresponding RH and IG words are combined to produce a word IL, where the RL and IL words are the real and imaginary parts respectively for the lower sideband of the selected center frequency translated about zero. The real and imaginary parts of the upper and lower sidebands are then processed by the power spectrum computing part of the spectrum analyzer, in the manner described in said Lehmann et al. patent, to get the power values for the spectral lines and to do any averaging that may be desired. The translation is done to a great extent by time-sharing the circuitry otherwise used for conventional spectrum analysis. A separate circuit, primarily analog, is used in the third mode to reduce the frequency content of very fast input signals so they can be effectively analyzed.

BRIEF DESCRIPTION OF THE DRAWINGS

FIG. 5 is a block diagram of the portion of said spectrum translator relating to a digital filter configuration.

FIG. 7 is a block diagram of a portion of said spectrum translator relating to processing control.

FIG. 11 is a chart illustrating a timing sequence for modified direct Fourier transform calculations in said spectrum analyzer.

DETAILED DESCRIPTION

Figure 1:
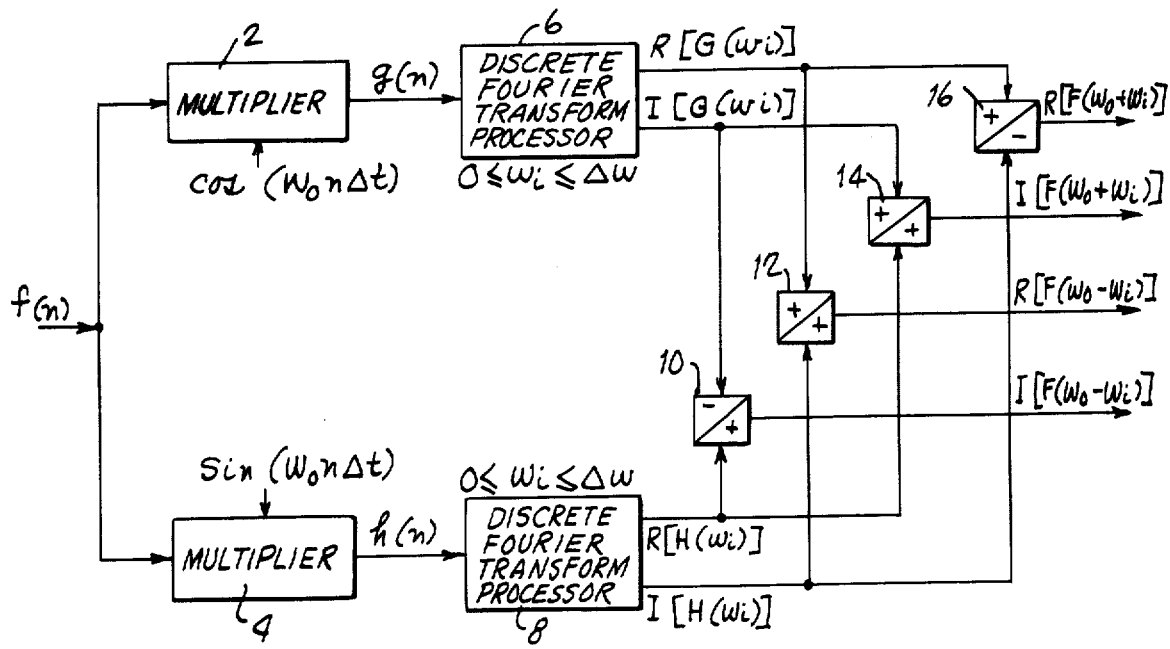
FIG. 1 is a functional block diagram illustrating some principles of generating a translated spectrum.
Figure 2A:
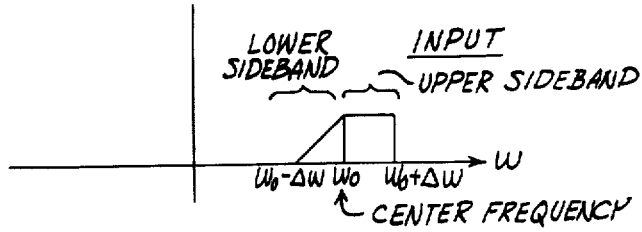
FIG. 2a, 2b and 2c are plots of the frequency spectrum for an input signal and the upper and lower sidebands of the same signal translated about zero frequency.
Figure 2B:
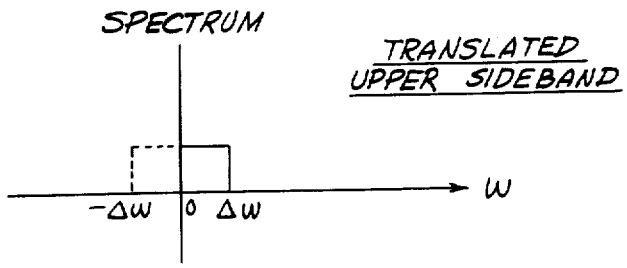
Figure 2C:
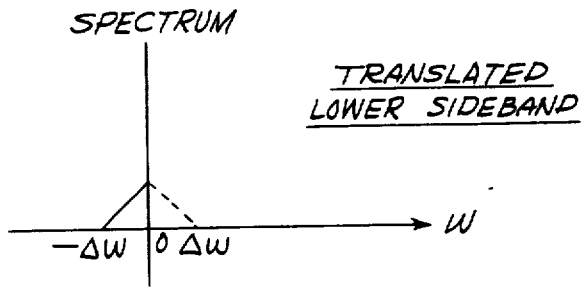

The principles of the frequency shift or translation used in the invention can be described in general terms in connection with FIGS. 1 and 2a-2c. FIGS. 2a-2c illustrate the shift or translation of an exemplary frequency band of interest, which starts at a frequency above zero, to an upper and a lower sideband of its center frequency translated about zero frequency, while FIG. 1 illustrates qualitatively and very generally what takes place in accordance with the invention to produce the effect of such shifting or translation.

Referring to FIG. 2a, assume that the frequency of interest in the analog input signal to a spectrum analyzer has a center frequency of $w_o$ and its width is from $w_o - \Delta w$ to $w_o + \Delta w$. Without frequency translation, the spectral lines of the spectrum analyzer would be distributed uniformly from zero frequency to the frequency $w_o + \Delta w$, and the results derived for the spectral lines from zero frequency to $w_o - \Delta w$ would be wasted. With frequency translation in accordance with the invention, the effect is to shift the upper sideband (the sideband from $w_o$ to $w_o + \Delta w$) to the position shown in FIG. 2b and to shift the lower sideband (from $w_o - \Delta w$ to $w_o$) to the position shown in FIG. 2c. Now, if the band shown in FIG. 2b is analyzed, all of the spectral lines would be in the range from zero to $\Delta w$, and the results for all of the spectral lines would be useful. A similar consideration applies to the lower sideband.

Referring to FIG. 1, assume that the input analog signal has been sampled at a time interval $\Delta t$ and converted into a sequence of N digital words, $f(n)$. In accordance with the general principles of the invention, each of the digital words $f(n)$ is multiplied at multipliers 2 and 4 by respective cosine and sine functions which have an argument including a value, $w_o$, representing the center frequency of the frequency band of interest. The argument of each trigonometric function additionally includes a multiplier, $n$, representing the number of the sample within the sequence. The sample time interval, $\Delta t$, is also included. The outputs of the multipliers 2 and 4 are two sequences, each N digital words long, of words $g(n)$ and $h(n)$, which can be expressed as:

$$g(n) = f(n) \cos (w_o n \Delta t)$$

$$h(n) = f(n) \sin(w_o n \Delta t) \tag{1}$$

The digital words $g(n)$ and $h(n)$ are applied, as sequences of real words (as opposed to complex words) to respective discrete Fourier transform processors 6 and 8, each providing at its output the real and the imaginary part of a discrete Fourier transform of its input for the frequency range from 0 frequency to $\Delta w$ frequency. Thus, the output of the processor 6 is the discrete Fourier transform $F[g(n)]$ of the digital words $g(n)$, and the output of the processor 8 is the discrete Fourier transform $F[h(n)]$ of the digital words $h(n)$. In conventional Fourier series notation (where: R and I designate the real and imaginary part respectively of a complex term; the subscript, $i$, designates a frequency; and $j$ is the complex operator) the discrete Fourier transforms of the words $g(n)$ and $h(n)$ can be expressed as:

$$F[g(n)] = R[G(w_i)] - jI[G(w_i)]$$

$$F[h(n)] = R[H(w_i)] - jI[H(w_i)] \tag{2}$$

In accordance with the invention, the R and I outputs of the processors 6 and 8 are combined as illustrated in arithmetic devices 10, 12, 14 and 16, which add or subtract as indicated, such that the outputs of devices 10 and 12 are respectively the imaginary and real parts of the discrete Fourier transform over the lower sideband of the frequency band of interest of the input signal represented by the digital words $f(n)$, and the outputs of devices 14 and 16 are respectively the imaginary and real parts of the discrete Fourier transform over the upper sideband of the frequency band of interest represented by the same input digital words $f(n)$. The outputs of devices 10, 12, 14 and 16 can be represented by the following expression for the Fourier transform $F(w_o \pm w_i)$ of the frequency band of interest, where $o \leq w_i \leq \Delta w$:

$$F(w_o \pm w_i) = R[G(w_i)] \mp I[H(w_i)] - j\{R[H(w_i) \pm I[G(w_i)]\} \tag{3}$$

Now the outputs of devices 10, 12, 14 and 16 can be processed by the remainder of the spectrum analyzer as described in said Lehmann et al. patent to find the power spectrum of the frequency band of interest at the optimal resolution afforded by this invention.

Figure 3:
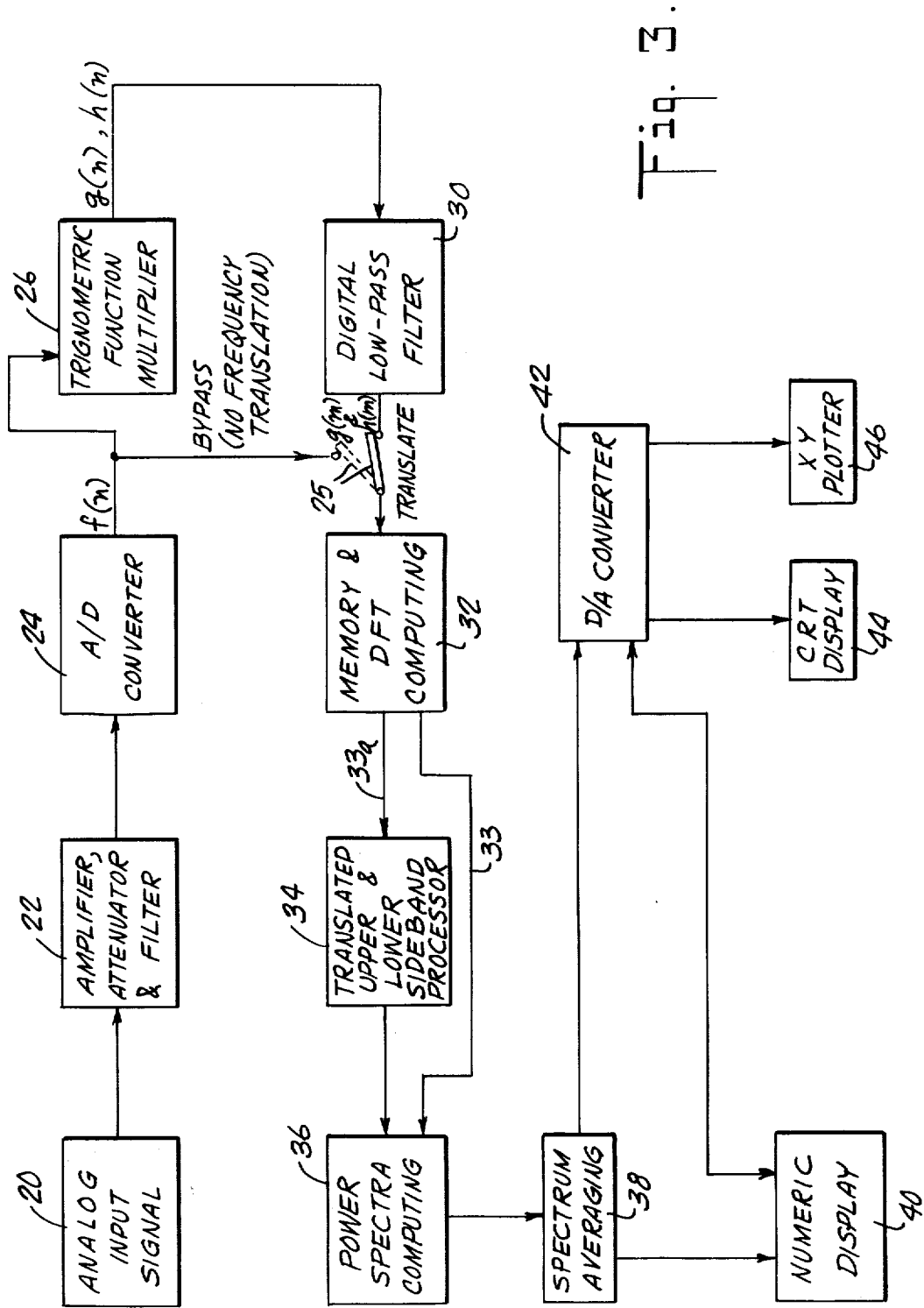
FIG. 3 is a simplified and generalized block diagram of a spectrum analyzer and translator in accordance with the invention.

While FIG. 1 illustrates only the general principles of the invention and not an actual implementation, FIG. 3 illustrates, in generalized block form, the major portions and the information flow in an exemplary embodiment of the invention in a spectrum analyzer for analyzing input signals with or without frequency shift or translation. Certain portions of FIG. 3 correspond to portions of the spectrum analyzer disclosed in said Lehmann et al. patent, and are described very briefly in this specification, while other portions are used specifically for the frequency shift or translation and are described here in greater detail. As in the spectrum analyzer in the Lehmann et al. patent, an analog input signal 20 is amplified (or attenuated) and filtered at 22, and is converted at 24 to N digital samples or words $f(n)$. If there is no need for frequency shift or translation, a bypass switch 25 is in the position illustrated by dotted lines and the spectrum analyzer operates as in said Lehmann et al. patent by computing the discrete Fourier transform of the words $f(n)$ at 32 (or a subset of these words, i.e., less than N), applying the results through a bypass line 33 for power spectrum computing at 36 and then spectrum averaging at 38, if desired, such that the results can be displayed numerically at 40 or converted to analog form at 42 and displayed at devices such as a CRT display 44 or an XY plotter 46.

If a frequency shift or translation is desired, the bypass switch 25 is the solid line position and the unit 32 receives not the digital words $f(n)$ but digital words $g(m)$ and $h(m)$, which result from filtering the digital words $g(n)$ and $h(n)$ discussed in connection with FIG. 1. Specifically, the digital words $f(n)$ from the converter 24 are processed by a trigonometric function multiplier 26 to generate a sequence of digital words $g(n)$ and digital words $h(n)$, which are the same as the words discussed in connection with the output of multipliers 2 and 4 of FIG. 1, and the output of the trigonometric funciton multiplier 26 is applied to a digital low pass filter 30, which generates a corresponding sequence of words $g(m)$ and words $h(m)$, where $m = 1, 2, ..., M$, and M is typically less than N, i.e., the word rate of each of $g(m)$ and $h(m)$ is less than the word rate of $f(n)$. As one example, $N = 50 \times 512$ and $M = 512$, but this is an arbitrary choice, and in fact, other choices for N and M and other rtios of N to M may be used within the scope of this invention. The output of the filter 30 is processed by time-sharing in accordance with the invention at the unit 32 to provide at its output 33a the real and imaginary part of the discrete Fourier transform of each of the words $g(m)$ and $h(m)$. These real and imaginary parts are processed at a translated upper and lower sideband processor 34, which carries out the function of arithmetic devices 10, 12, 14 and 16 of FIG. 1, and the output of processor 34 is processed as in the Lehmann et al. patent to provide the desired spectrum analysis results. For the purpose of time-sharing, and therefore reducing the cost and complexity of the spectrum analyzer, the digital words $g(n)$ and $h(n)$ are processed in sequence at the same filter 30, where the aliasing errors that may result from the reduction of the signal bandwidth (from greater than $w_o + \Delta w$ to $\Delta w$) are prevented or reduced. Similarly, the computing at 32 and the processing at 34 are also in sequence, with time-sharing or multiplexing.

As a specific example illustrating the embodiment of FIG. 3, assume that an analog input signal from the source 20 is suitably amplified (or attenuated) and filtered at 22 and is applied to the analog-to-digital converter 24. Further assume that the analog input signal from the source 20 has a frequency spectrum of interest from 12,300 Hz to 13,300 Hz. Then, further assuming that the maximum number of spectral lines is 256 and the frequency range for analysis is set from 0 to 25.6 KHz, the spectral lines are separated from each other by 100 Hz. Thus, only 10 lines would cover the spectrum of interest, and the resolution would be 100 Hz. To provide greater resolution, the frequency band of interest is translated, in accordance with the invention, from a band about a selected center frequency to a band about zero center frequency. A center frequency of 12,800 Hz ($w_o$) and a frequency range of 1024 ($\sim 2\Delta w$) are selected. This provides coverage of the range from 12,288 Hz to 13,312 Hz, with a resolution of 4 Hz between the spectral lines covering the band of interest. In carrying out this example, the analog signal is sampled and digitized at a suitable rate to generate successive digital words $f(n)$. Each digital word is combined with two trigonometric functions at 26 to form a corresponding digital word $g(n)$ and a corresponding digital word $h(n)$. These words are digitally filtered at 30, where the filtering process converts the words g(n) to words g(m) and converts the words h(n) to words h(m). The words g(m) and h(m) are serially stored in the memory at 32, one sequence of M words at a time. Then the contents of the memory at 32 are serially read out and circulated through an arithmetic unit at 32, which computes the real part and the imaginary part of a discrete Fourier transform representation of the sequences of $M(=512)$ words g(m) and M words h(m) for each of 128 spectral lines for each sequence of M words. The computed real and imaginary parts are combined at 34 to carry out the function of devices 10, 12, 14 and 16 of FIG. 1 to provide thereby another two sets of 128 real and imaginary values, each value representing a different spectral line for the upper or lower translated sideband. These computed real and imaginary parts of the upper and lower sidebands are combined at 36 to provide 256 values, each value representing the power spectrum of one of the 256 selected spectral lines. If averaging is desired, the power spectra values computed at 36 (for each of a number of successive sequences of two sets of M words) are averaged at 38. The averaged values for each of the selected 256 spectrum lines may be displayed at the numeric display 40 and at the CRT display 44 and the XY plotter 46.

It is again noted that the choice of sequences of $N = 25,600 (= 50 \times 512)$ words $f(n)$, $M = 512$ words $g(m)$ and $M = 512$ words $h(m)$, and 128 spectral lines for each sequence is arbitrary, and that other suitable numbers may be chosen instead.

Referring to FIG. 4, which is a more detailed functional block diagram of the spectrum analyzer and spectrum translator, and includes elements described in more detail in said Lehmann et al. patent, it is noted first that the indicated sequence of operations or circuits does not necessarily represent the time sequence in which actual operations are performed or the actual circuitry employed, but illustrates an exemplary information flow sequence. In FIG. 4, a time-varying analog input signal from a source 20 is applied to an input amplifier and attenuator 44 through a DC isolation capacitor 46. The gain of the amplifier and attenuator 44 is controlled by means of an input gain control 47 such that, for example, an input voltage of 0.1 volts RMS corresponds to 0 db attenuation, etc. The exemplary sample rate, 102.4 Ksps, is four times the exemplary upper limit of 25.6 Khz for the input signal to the spectrum analyzer. An input calibration control 48 selects a calibration signal provided by a source 48a through a DC isolation capacitor 48b. The calibration signal may be, for example, a square wave having a 0.1 volt RMS fundamental frequency component at a frequency equal to ⅛ of the sample rate for the words $f(n)$. The fundamental frequency of the square wave from the input calibration generator 48a is at the center of a frequency range selected for analysis. For example, if the frequency range from 0 to 25.6 Hz is selected for analysis, the frequency of the square wave from the input calibration generator 48a is 12.8 Hz. The output of the input amplifier and attenuator 44 is applied to a tunable Chebychev filter 50 of conventional construction and operation providing a minimum of approximately 60 db attenuation of signals which would cause aliasing error. A control 51 is used to select one of a plurality of frequency ranges for analysis (i.e., to select the maximum frequency which is to be analyzed). For example, the selector 51 may be used to select a frequency range from 0 to 25.6 Hz, or one of several multiples thereof, the highest multiple being from 0 to 25.6 KHz. Each range is divided into 256 uniformly distributed spectral lines, and the equivalent line bandwidth is the analysis range divided by the number of spectral lines. For example, if the analysis range is from 0 to 25.6 KHz, the line bandwidth for each spectral line is 100 Hz; if the analysis range is from 0 to 1024 Hz, the line bandwidth is 4 Hz; all line bandwidths being the equivalent noise bandwidth for a rectangular window.

The analog signal output from the filter 50 is applied to an analog-to-digital converter 54 through a summing network 52. The summing network 52 also receives the output of a noise source 56 for noise whose statistical distribution is controlled. This addition of statistically controlled noise from the source 56 to the analog input signal of the spectrum analyzer provides resolution beyond that which would be otherwise available for the word length used in the analyzer. A full description of this technique is found in Lehmann et al. U.S. Pat. No. 3,877,022. The output of analog-to-digital converter 54 is a sequence of digital words $f(n)$ representing successive samples of the filtered analog input signal from the source 20. The rate at which the analog signal is sampled by the analog-to-digital converter 54 is chosen to be four times the maximum possible analysis range, i.e., 102.4 Ksps, but a different sampling rate is possible so long as Nyquist's sampling theorem is satisfied. The spectrum analyzer is timed by a clock oscillator 58 which may, for example, operate at 45.87 MHz. Its output is applied directly to the analog-to-digital converter 54 to provide it with count pulses, and is also applied to timing dividers 60 whose outputs are applied to all other blocks shown in FIG. 4 to serve as timing signals. A sample rate generator 62 is controlled by frequency range selector 51 to provide suitable sample rate pulses to ccalibration generator 48a, to analog-to-digital converter 54 and to a recirculating memory 64. An overload light 54a indicates an overload condition of the analog-to-digital converter 54.

The portion of the spectrum analyzer which is specifically concerned with frequency translation includes digital multipliers 118 and 120 receiving the digital words from the analog-to-digital converter 54. A control 116 is used to select a center frequency for the frequency band which is to be translated to zero center frequency. In accordance with the principles of the invention outlined above, the output of the center frequency control 116 is applied to a digital frequency synthesizer 114 to obtain two sequences of digital words in quadrature with each other, cosine and sine words, each having an argument incremented with a value which is a function of the selected center frequency. The output of the center frequency control 116 is additionally used to provide a digital center frequency output to an LED (light emitting diode) readout 117.

The digital multiplier 118 receives as one of its inputs the digital words $f(n)$ from analog-to-digital converter 54 and as its second input the digital cosine output words from digital frequency synthesizer 114. In a similar fashion a digital multiplier 120 receives as one of its inputs the same digital words $f(n)$ and as its second input the digital sine output words from digital frequency synthesizer 114. The output of digital multiplier 118 is words g(n) each of which is the product of a digital word $f(n)$ and a cosine function having an argument increment in accordance with the center frequency selected at 116, and these words g(n) are applied to a digital low pass filter 122. In a similar fashion the output of digital multiplier 120 is words $h(n)$ each of which is the product of a digital word $f(n)$ and a sine function having an argument incremented in accordance with the center frequency selected at 116, and these words $h(n)$ are applied to a digital low pass filter 124. The digital words or samples $g(n)$ and $h(n)$ are each applied to the filters 122 and 124 at an exemplary rate of 102.4 Ksps. As discussed in more detail below, the low pass digital filtering prevents or reduces aliasing errors, and at the same time reduces the relevent sampling rate. The filter cutoff frequency is determined by one-half the maximum frequency range selected at 51, since the total range, $2\Delta w$, is analyzed as 0 to $\Delta w$ and 0 to $-\Delta w$, two half ranges. The sample rate is reduced to four times the filter cutoff frequency. For example, if the selector 51 is set to select a frequency range from 0 to 10.24 KHz, the filter cutoff frequency is 5.12 Khz while the samples are output at a rate of 20.48 Khz from each of the filters 122 and 124.

The filtered $g(n)$ and $h(n)$ words, $g(m)$ and $h(m)$, are applied through the multiplexer 126 in an interleaved manner to a recirculating memory 64, which may have sufficient capacity to store two sets of 512 words or a total of 1024 words each 8-bits long. As in said Lehmann et al. patent, the recirculating memory 64 starts storing 8-bit words in one of two modes: trigger and continuous. In a continuous mode, the memory 64 stores the 8-bit words supplied by the multiplexer 126 until it contains a full sequence of 1024 words, then reads out its contents and, without further triggering, but after a suitable delay, starts storing a new sequence of 1024 words, etc. In a trigger mode, the memory 64 is triggered to start storing 8-bit words supplied by the multiplexer 126 and when each of its 1024 word locations is storing a word, it transfers out its contents, and repeats the cycle only when triggered again. When the trigger mode has been selected by a selector 68, a further selector 70 is used to apply to the recirculating memeory 64 one of three possible triggering sources: internal trigger, external trigger and manual trigger. The internal trigger is a suitable triggering signal derived, for example, from the analog input 20; the external trigger can be any suitable externally supplied triggering signal, such as a triggering signal derived from line frequency, and the manual trigger is a switch for manually triggering the recirculating memory 64.

After the recirculating memory is full, i.e., after it contains the two full sequences of 512 8-bit words $g(m)$ and $h(m)$, its contents are read out serially, at a high rate, and are applied to a window function stored in a suitable memory. Each of the 512 8-bit words $g(m)$ and $h(m)$ provided by the recirculating memory 64 is combined with a selected window function, $W(m)$, by the window function multiplier 72, and the resulting two sequences of 512 words $g(m) \cdot W(m)$ and 512 words $h(m) \cdot W(m)$, which by this time are each 9-bits long, are stored in another recirculating memory 76. The two sequences of 512 9-bit words stored in the memory 76 are read out at a high rate sequentially and nondestructively and are applied to a multiplier 78 as one of its two inputs. The other input to the multiplier 78 is one of the trigonometeric functions values stored in a READ ONLY memory 80 which are read under the control of a coefficient address generator 82.

The purpose of multiplier 78, trigonometric function memory 80 and coefficient address generator 82 is to provide RG', IG', RH' and IH' words defined as:

$$RG' = g(m) \cdot W(m) \cos(2\pi\ mk/M)$$
$$IG' = g(m) \cdot W(m) \sin(2\pi\ mk/M)$$
$$RH' = h(m) \cdot W(m) \cos(2\pi\ mk/M)$$
$$IH' = h(m) \cdot W(m) \sin(2\pi\ mk/M) \quad (4)$$

where $g(m) \cdot W(m)$ and $h(m) \cdot W(m)$ represent the $m$-th of the sequence of $M(=512)$ words from the recirculating memory 76, $k$ represents one of the 128 spectral lines of interest, and $c$ is a constant. For one sideband $0 \leq k \leq 127$ and for the other sideband $1 \leq k \leq 128$, so that the total range of $k$, for both sidebands, is 256.

To compute the RG' and IG' words, each of the 512 $g(m) \cdot W(m)$ 9-bit words from the recirculating memeory 76 is multiplied by the cosine function whose argument includes a value of 1 for $k$ representing the first spectral line and by a sine function including a value of 1 for $k$ for the same first spectral line. To compute the RH' and IH' words, each of the 512 $h(m) \cdot W(m)$ 9-bit words from the recirculating memory 76 is similarly multiplied by the cosine function whose argument includes a value of 1 for $k$ representing the first spectral line and by a sine function including a value of 1 for $k$ for the same first spectal line. Then the procedure is repeated for arguments including a $k$ value of 2 representing the second spectral line first for the $g(m) \cdot W(m)$ words and then for the $h(m) \cdot W(m)$ words, etc. until the $k$ value for the last of the 128 spectral lines of interest has been used. For each spectral line, the 512 words RG' are accumulated at 84 to obtain a value represented by the expression $$\sum_{1}^{M}(1/m)RG' = RG,$$

and the 512 words IG' are accumulated at 86 to get a value represented by the expression $$\sum_{1}^{M}(1/m)IG' = IG.$$

Similarly, for each spectral line, the 512 words RH' are accumulated at 85 to get a value represented by the expression $$\sum_{1}^{M}(1/m)RH' = RH,$$

while the 512 words IH' are accumulated at 87 to get a value represented by the expression $$\sum_{1}^{M}(1/m)IH' = IH.$$

For each spectral line, the entire contents of recirculating memory 76 are applied to multiplier 78, and each of accumulators 84, 85, 86 and 87 sums a sequence of 512 values. Then, for each spectral line the contents of accumulators 84, 85, 86 and 87 are suitably transferred to a network 129 to provide the necessary combining of the outputs of these accumulators. For each spectral line the IH word is subtracted at 136 from the RG word to provide an RU word representing the real part of the upper sideband translated about zero center frequency. For each spectral line the IG word and the RH word are added at 134 to provide an IU word representing the imaginary part of the upper sideband translated about zero center frequency. In a similar fashion for each spectral line the RG word and the IH word are added at 132 to provide an RL word representing the real part of the lower sideband translated about zero center frequency, and for each spectral line the IG word is subtracted at 130 from the RH word to provide an IL word representing the imaginary part of the lower sideband translated about zero center frequency. Then the accumulators 84, 85, 86 and 87 are cleared to prepare each for summing another sequence of 512 values associated with the succeeding spectral line. After the entire contents of the recirculating memory 76 have been processed in the indicated manner 128 times, the subtractor 136 has contained sequentially the 128 words representing the real part of a discrete Fourier transform representation of the upper translated sideband signal of the 128 spectral lines, while the adder 134 has contained sequentially the corresponding imaginary parts of said representation. The adder 132 has contained sequentially the 128 words representing the real part of a discrete Fourier representation of the lower translated sideband signal of the 128 spectral lines, while the subtractor 130 has contained sequentially the corresponding imaginary parts of said representation.

In order to calculate the power spectrum value for each spectral line, the sums formed by adders 132 and 134 and differences formed by subtractors 130 and 136 are converted to floating point format at a converter 88, and are applied to a calculator 90 which squares the R and I values associated with each sideband and finds their sum by the procedure described in detail in said Lehmann et al. patent. The output of the calculator 90 is a series of words in floating point format, each word representing the power of one of the 256 spectral lines (for the full bandwidth) distributed entirely within the translated frequency band.

A selected number of successive power spectra (successive sets of 256 spectral line words) may be averaged under the direction of an averager control 94. Specifically, to average power spectra, successive sequences of the two sets of 512 8-bit words are read into recirculating memory 64 as described above and are processed as described above, with the result that calculator 90 provides at its output successive sets of 256 power spectrum words. After an averaging interval (e.g. = 1024) has been selected by a control 96, the first set of 256 power spectrum values from calculator 90 pass through a summing device 92 and through an averager control 94 and are stored in a recirculating memory 98, whose capacity may be 256 words each 20-bits long. For the next set of 256 values from the calculator 90, the power spectrum value for each spectral line stored in recirculating memory 98 is added, but summing device 92, to the corresponding line value from calculator 90 and the sum of these two values for the same spectral line is stored in the place for that spectral line in recirculating memory 98. This process continues until 1024 sets of 256 power spectra $X_k$ ($k$ identifies the spectral line whose power value is X) have been so accumulated in recirculating memory 98.

For the purpose of providing a running average of the power spectrum value for each spectral line, each of the words $X_{k,p}$ (where $p$ is the number of words $X_k$ which have been summed so far) in recirculating memory 98 is divided by 2 each time $p$ is an integer power of 2. In order to provide a true running average during the time between divisions by 2, an averager correction factor source 100 provides correction factors corresponding to the current value of $p$, i.e., corresponding to the number of spectral sums accumulated in memory 98. The contents of memory 98 and the correction factors from source 100 are applied to an interface 102 whose purpose is to combine the output of recirculating memory 98 with the correction factors from the source 100 and to provide a digital output to numeric display 40 and its LED (light emitting diode) readout 40a, and to provide analog output to XY plotter 46 and CRT 44, such that the displays can show only true running averages.

Averaging can be started, stopped or resumed by means of a control 104; a selected spectrum frequency line may be marked by means of a control 106; and the amplitude in dB's, the frequency in Hz and the averaging time (i.e., the time remaining to complete an averaging cycle) are displayed by numeric display 40 when selected by a control 40b. If no averaging is desired, control 96 is set to "average" only a single set of 256 power spectrum words.

The low pass digital filters 122 and 124 in FIG. 4a were described above only by function because a digital filter of conventional configuration could be used in the spectrum analyzer described here. However, a special purpose digital filter, which has important improved characteristics, is used in the exemplary embodiment described in this specification and an embodiment of this filter is illustrated in FIG. 5. The filter of FIG. 5 receives the input samples (which may be $g(n)$ and $h(n)$ at a clock rate of 102.4 Ksps, at a type A filter 500A, which is a conventional finite impulse response (FIR) digital filter defined by 35 coefficients and a filter cutoff frequency at its output of 1/20th of the sample rate of its input. The output of the type A filter 500A is reduced in sample rate by 5 at 520A to thereby provide an effective sample rate, at the output of unit 520A, of 20.48 Ksps. If the 10.24 KHz analysis range had been selected at 51 (FIG. 4a) the output of unit 520A is delivered to the multiplexer 126 in FIG. 4a for further processing. The output of the unit 520A is also applied to another FIR digital filter 510A, which is a type B filter and is similar to the type A filter but is defined by only 15 coefficients and a filter cutoff frequency at its output of ¼ of the sample rate of its input. If the 5.12 KHz analysis range had been selected at 51, the output of a sample rate divider 530A, which divides by 2 the sample rate of the output of type B filter 510A, is applied to the multiplexer 126 of FIG. 4a instead of the output of unit 520A. The digital filter of FIG. 5 has further stages identical to the one described above, as illustrated in FIG. 5, and is thus capable of providing the illustrated outputs which can be selectively applied to the multiplexer 126 depending on the analysis range selected at 51 of FIG. 4a.

The filter of FIG. 5 provides, in accordance with the invention, faster processing with less multiplications and less hardware than a conventional FIR filter. In a conventional FIR digital filter the coefficients which define the impulse response are convolved with the input sample sequences by multiplying each coefficient by the past history of its input terms. The sum of the resulting products is the output sample for the filter. Thus, an implementation using a single conventional FIR digital filter requiring a 1,000 to 1 reduction in data bandwidth, as for the case of a starting frequency of interest of 25.6 KHz and a sample output having a cutoff frequency of 25.6 Hz, would require the desired impulse response sampled at 102.4 Ksps, the sample rate of its input. Many samples would be required to define the necessary very long impulse response of such filter. In contrast, the filter of FIG. 5 is cascaded and requires only a succession of FIR filters each having a relatively small number of coefficients, with the last filter requiring the impulse response sampled at only 102.4 sps, i.e., only 1/1000 of the sample rate of such conventional implementation.

Figure 6:
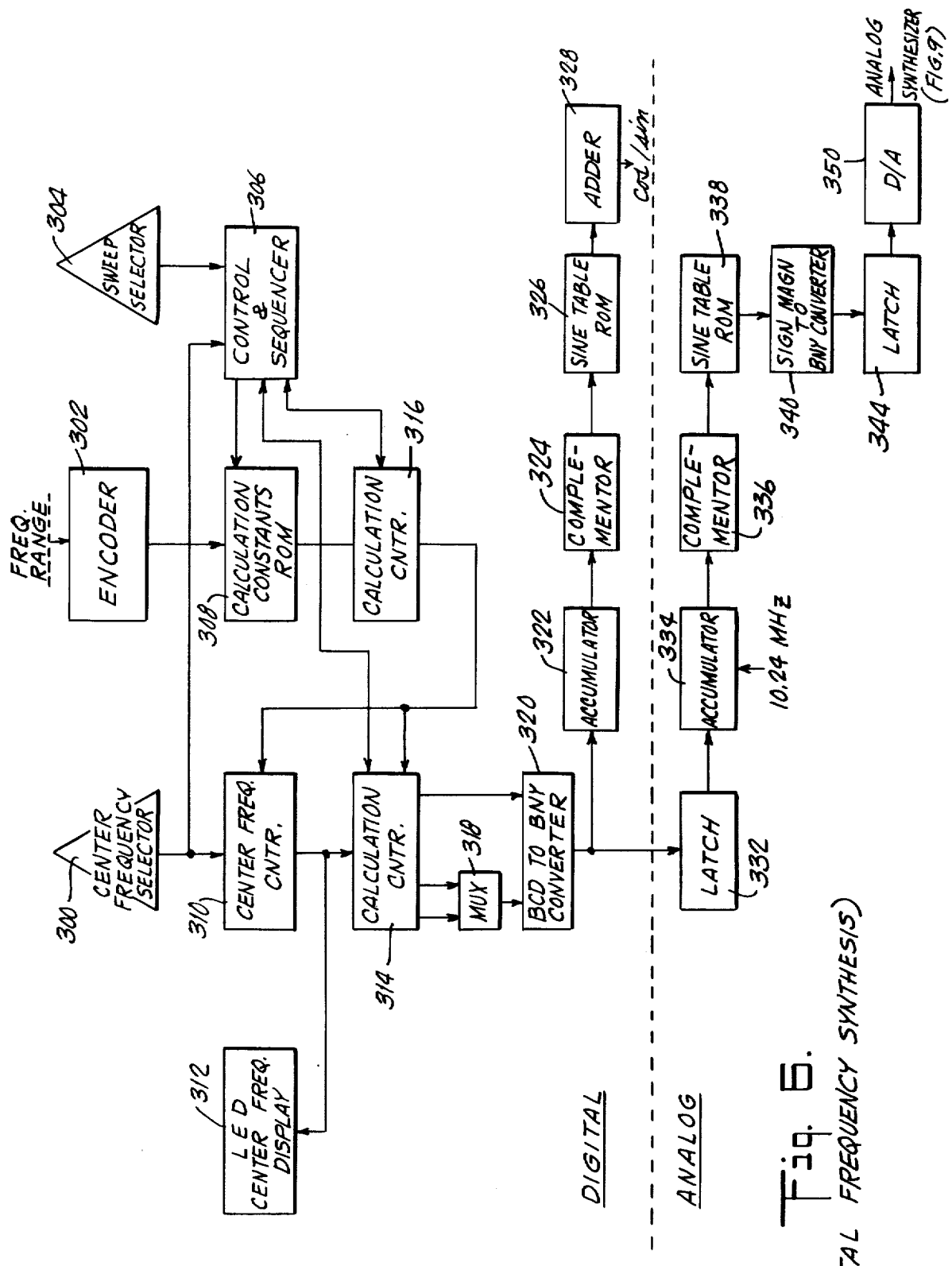
FIG. 6 is a block diagram of a portion of said spectrum translator used for digital frequency synthesis.

The digital frequency synthesizer 114 of FIG. 4a was described above as providing digital words having the requisite values related to the selected center frequency of interest. While a conventional addressable ROM (read only memory) can be used to store the necessary words as a look-up table, a particularly efficient synthesizer is used in the invented spectrum analyzer. This synthesizer is shown in FIG. 6 and provides, as previously described, a sequence of digital cosine and sine samples, each sample having an argument incremented with a value determined by the selected center frequency. In addition, the synthesizer includes a frequency limit detector which determines whether the selected center frequency, $w_o$, and the selected frequency range for analysis, $2\Delta w$, are compatible; if not, the front panel center frequency LED readout flashes to indicate an improper combination. The combinations that violate the operating conditions are:

$$w_o < \Delta w$$
or
$$w_o + \Delta w > 25.6 \text{ KHz} \tag{5}$$

Still in addition, the synthesizer of FIG. 6 includes a frequency sweep selector to automatically sequence from the selected center frequency such that a plurality of different frequency bands of interest may be automatically evaluated.

Referring to FIG. 6 for more detail on the frequency synthesizer, an encoder 302 receives an input from control 51 (FIG. 4a), which selects one of a plurality of nine frequency bands for analysis. The band selection is encoded by encoder 302 into a 4-bit binary word which addresses a calculation constant ROM 308. The contents of the addressed location in ROM 308 are pairs of limit values which are the maximum and minimum selected center frequencies allowable for each of the nine possible frequency bands for analysis. The maximum and minimum limit values are used in determining if any one of the improper combinations defined above have been selected. For example, if the frequency range of the spectrum analyzer is 0 to 25.6 KHz, the minimum allowable center frequency for a band which is 256 Hz wide would be 128 Hz while the maximum allowable center frequency would be 25.472 KHz (25.6 KHz − 128 Hz).

The desired center frequency is selected at selector 300, which has several momentary pushbutton switches (not shown) on the front panel (not shown) of the spectrum translator. Depressing a center frequency pushbutton advances the value of an associated decimal digit in a center frequency counter 310. The digit is advanced one count for the first second after depression, and if the pushbutton remains depressed beyond the first second, the digit advances at a rate of approximately two counts per second. The current count on the center frequency counter 310 is displayed at LED (light emitting diode) readout 312.

Whenever frequency range selector 51 (FIG. 4a) or center frequency selector 300 provides a new value, a control and sequencer 306 initiates recalculation of the operatin conditions to determine if the selected values are compatible. A calculation counter 314, under the direction of control and sequencer 306, is provided with the selected center frequency previously stored in the center frequency counter 310. In a like manner a calculation counter 316 receives the minimum center frequency for the selected frequency analysis range from ROM 308. The counters 314 and 316 are serially compared; if counter 314 is less than counter 316 (i.e., $w_o < \Delta w$), an incompatible pair of values has been selected, and display 312 is continuously flashed by a suitable control signal from control and sequencer 306 to indicate the error condition. If this first set of values is compatible, calculation counter 314, under the direction of control and sequencer 306, is again initialized with the selected center frequency previously stored in center frequency counter 310. In a like manner calculation counter 316 receives the maximum center frequency allowable for the frequency range of interest which is stored in ROM 308. The counters 314 and 316 are serially compared, and if counter 316 is less than counter 314, (i.e., $w_o + \Delta w > 25.6$ KHz) an incompatible value has been selected and the display 312 is continuously flashed to indicate an error condition.

If the selected center frequency and the selected frequency analysis range are compatible, calculation counter 314 (under the direction of control and sequencer 306) provides a converter 320, through a multiplexer 318, with the BCD encoded selected center frequency converted to binary form for use in an upcoming multiplication. The binary formatted center frequency is divided by $2^{10} \times 25$ to provide a phase increment per 90° to an accumulator 322. The output of the accumulator 322, which is now 12 bits long, is applied through a complementer 324, which maintains the true and complement values as inputs to a 90° sine table ROM 326. The ROM 326 stores 256 12-bit words of "coarse" magnitude representing the trigonometric coefficients for one quadrant of a wave cycle, and additionaly stores 16 4-bit words for interpolating between the 256 "coarse" words. An efficient technique used to address a ROM, such as ROM 326, by a single calculated address so as to give the required cosine and sine values at any point of a cycle is fully disclosed in said Lehmann et al. patent. The cosine and sine coefficient increments, which are now 12-bits long and in sign magnitude format, are provided in interleaved form at the output of ROM 326. The output of ROM 326 is rounded to 8-bit words at an adder 328, possibly with the addition of some random digital noise, and the output of adder 328 is a sequence of cosine and sine digital words having argument increments proportional to the selected center frequency. These words multiply the $f(n)$ words at multipliers 118 and 120 (FIG. 4a).

A sweep selector 304 initiates a frequency sweep when a sweep-up or a sweep-down pushbutton in it (not shown) is depressed, and terminates the frequency sweep when a sweep stop pushbutton (not shown) is depressed. The rate of sweep is a function of the frequency analysis range, selected at 51 (FIG. 4a), and is stored as a value in calculator constants ROM 308, from where it is applied to control and sequencer 306. The sweep rate is such that each frequency is evaluated in at least four separate analyses and is applied to CRT 44 (FIG. 4) for not less than 4 seconds. The sweep starts at the selected center frequency prior to depressing any of the sweep pushbuttons. The center frequency is discretely stepped either up or down, depending on the selection of a switch (not shown) on the front panel (not shown) of the spectrum translator, until it reaches the minimum or maximum center frequency for the selected frequency analysis range, provided the sweep stop pushbutton is not meanwhile depressed.

Figure 4B:
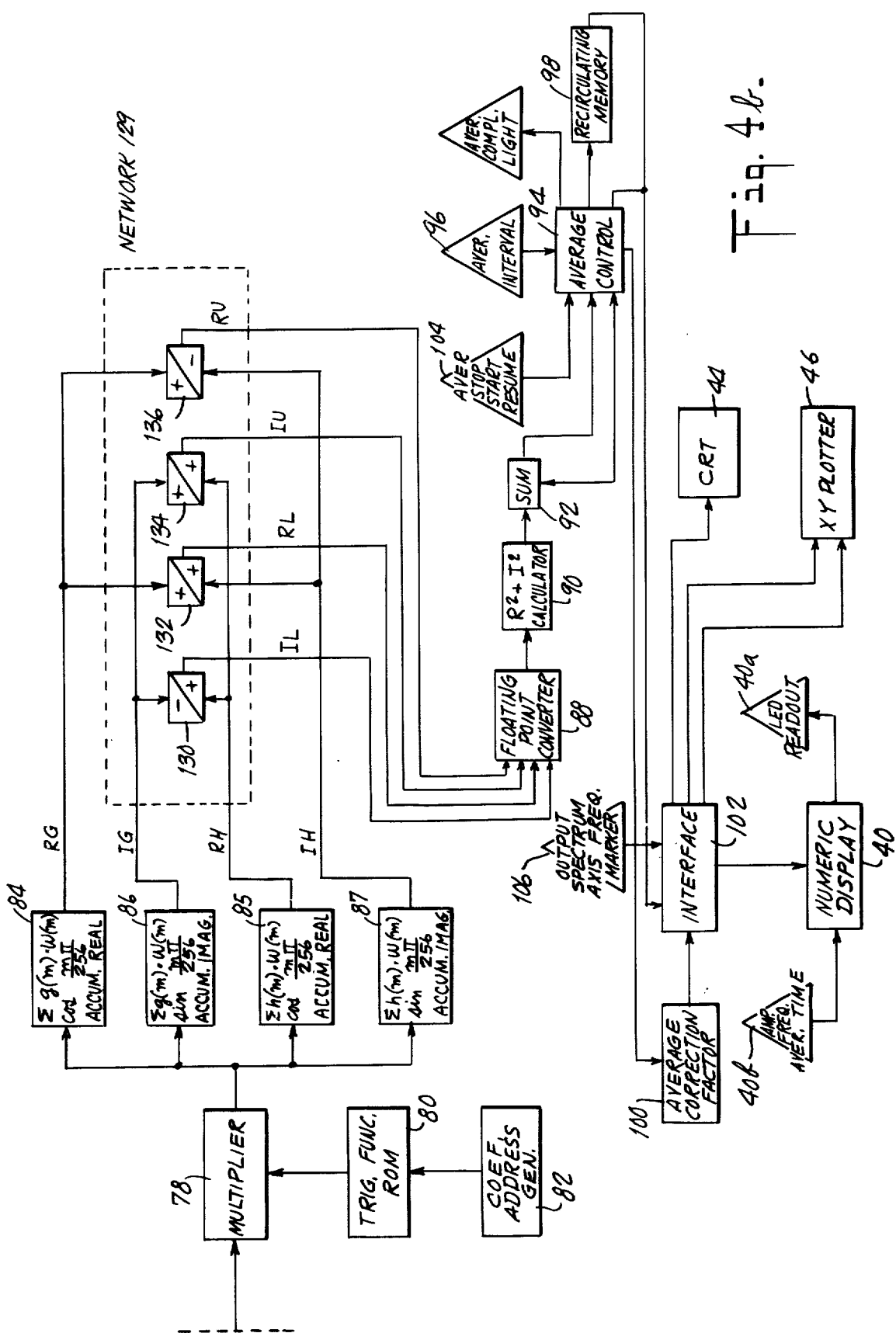
FIG. 4 is a more detailed functional block diagram of said spectrum analyzer and translator.
Figure 8:
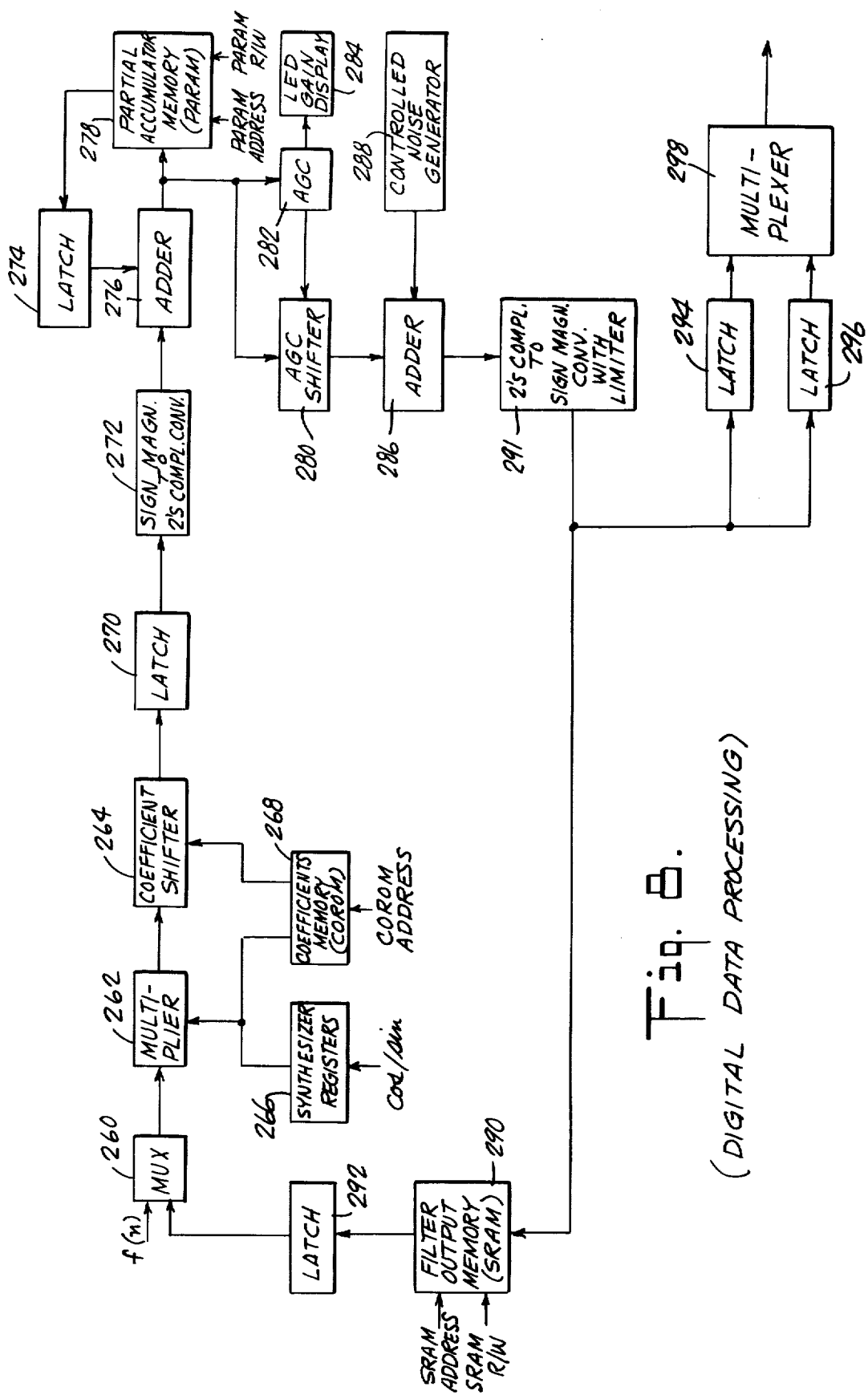
FIG. 8 is a block diagram of a portion of said spectrum translator used for digital data processing.

The portions of the spectrum analyzer of FIGS. 4a and 4b relating to translation are timed and controlled by the network illustrated in FIG. 7. This network provides the necessary timing signals for the phasing of the different operations required to be performed in a multiplexed and time-shared fashion so that duplication of expensive components, such as digital multipliers, can be avoided wherever possible. For example, the function of multipliers 118 and 120 (FIG. 4a), which serve to combine the digital words $f(n)$ with the cosine and sine words to provide $g(n)$ and $h(n)$ words, is performed by a single multiplier 262 (FIG. 8). The output of timing dividers 60 (FIG. 4a), which may be at an exemplary rate of 11.47 MHz, and the output of sample rate generator 62 (FIG. 4a) are applied to one input of a clock phasing circuit 180, whose outputs time the various operations in the spectrum translator, maintain synchronization between the spectrum analyzer and the spectrum translator and are applied to all the other blocks in FIG. 7. For example, referring back to FIGS. 4a and 4b, the words $f(n)$ go from A/D converter 54 to one input of digital multiplier 118. The digital frequency synthesizer 114 of the spectrum translator provides sequences of cosine samples to the other input of digital multiplier 118, which must be precisely in step with the $f(n)$ words from A/D converter 54. The sequencing is performed under control of timing dividers 60 and clock phasing 180 in the spectrum translator to provide the necessary synchronization. Note that an output of clock phasing 180 is applied to a program counter 182 and to a pipeline address phasing 188 (FIG. 7). This output is at an exemplary rate of 2.8 MHz, representing the highest processing rate for digital filters, and in phase to provide synchronization between program counters 182 and pipeline address phasing 188. Program counters 182 provide timing sequences in divisions of the basic clock rate for uniquely identifying sequences of time for performing various operations. More specifically, program counters 182 maintain a record of which samples are being processed at any particular time and with which digital filters these samples are associated. The unique sequences provided by program counters 182 are applied to a filter strobe decoder 184 and a coefficient read only memory (COROM) address generator 186. The decoded output states received by filter strobe decoder 184 uniquely identify processing time intervals for each one of the type A filters 500 and the type B filters 510. The output of filter strobe decoder 184 is applied to COROM address generator 186 and pipeline address phasing 188. COROM address generator 186 receives its inputs from filter strobe decoder 184, uniquely identifying processing time intervals for each one of the type A filters 500 and type B filters 510, and from program counters 182 uniquely indentifying processing time intervals for each impulse response coefficient. The output of address generator 186 is applied through pipeline address phasing 188 to address for reading out the coefficient values required for the digital filtering function stored in COROM 268 (FIG. 8). Pipeline address phasing 188 controls the phasing of registers and provides for clocking in and clocking out samples in the minimum time possible consistent with the need that the processed samples must be allowed to stabilize. Pipeline address phasing 188 also provides phasing for the different memories during the several phases of the clock cycle. A portion of the address supplied by COROM address generator 186 and the outputs of clock phasing 180 and filter strobe decoder 184 are combined to provide read/write signals and addresses that control a sample random access memory (SRAM) 290 (FIG. 8) and a partial accumulation random access memory (PARAM) 278. As explained with respect to FIG. 5, a number of coefficients and prior data samples define a filter output sample so that samples and coefficients are appropriately multiplied and accumulated to provide an output sample. These partial accumulations, as limited by the availability of input samples, are stored in PARAM 278 until an output sample has been calculated for a particular filter when it is stored in a SRAM 290 so that it can be made available as an input sample for the next filter in the cascaded configuration.

Referring to FIG. 8, which illustrates a portion of the spectrum translator for performing digital data processing, the digital words $f(n)$ are supplied by A/D converter 54 (FIG. 4) and are passed through a multiplexer 260 to one input of a multiplier 262. The other input to multiplier 262 is from synthesizer registers 266, which alternately provide cosine and sine samples from the digital frequency synthesizer in FIG. 6. First, the cosine sample is multiplied by the word $f(n)$ provided by the A/D converter 54; next the sine sample is multiplied by the same word $f(n)$. Multiplier 262 takes two 8-bit input words and provides a 16-bit output word. The output of multiplier 262, a translated 16-bit word, is passed through coefficient shifter 264, with no effect on the translated word (the function of coefficient shifter 264 and the other blocks which have no effect on the translated samples will be discussed below in connection with the filter samples), and then goes to a latch 270, thereby freeing up multiplier 262 and coefficient shifter 264 to allow them to start on another set of words. The output of latch 270 is converted from sign magnitude to 2's complement format at converter 272. Multiplier 262 operates on sign magnitude sample words, while adders 276 and 286 require samples to be in 2's complement format.

During the translation phase, the sample word is passed through an adder 276 and an automatic gain control (AGC) shifter 280, both of which have no effect on the translated words, and is applied as one input to an adder 286. At this point the translated sample word is 16-bits, and is reduced to an 8-bit word in an adder 286. The 8-bit output of adder 286 is converted from 2's complement to sign magnitude format at 291 for use in subsequent multiplications. A limiter function network at 291 prevents overflows. The output of converter 291 is stored in SRAM 290 under the control of a SRAM address generator and the SRAM read/write signal. As previously pointed out, SRAM 290 maintains sample outputs for each of the filters and for the translated values. Thus, SRAM 290 holds eight sets of samples, seven sets for each of the filters and one set of translated samples. The B-type filters 510d, e and f are never needed simultaneously; thus one set of samples for them in SRAM 290 is enough.

After the cosine translated sample is stored in SRAM 290, the sine translated sample is generated and follows the same path as the previous cosine sample and is also stored in SRAM 290. Once both translated samples are processed, the filtering function commences. The first filter requires the previously stored translated values as inputs. The samples are sequentialy read out of SRAM 290, under control of the SRAM address generator and the SRAM read/write signal, through multiplexer 260 and as one input to multiplier 262. At this point the other input to multiplier 262 is one of the coefficients stored in COROM 268 and defining the first filter 500A in FIG. 5. Thus, for example, as previously discussed with reference to FIG. 5, a type A filter 500 is defined by 35 different coefficients, i.e., requires multiplication by at least 35 different sequential data input samples to generate an output.

The resulting 16-bit multiplier output samples are an input of coefficient shifter 264. The other input to coefficient shifter 264 is the exponent of the coefficient stored in COROM 268, and the result of shifter 264 is a normalized 16-bit word, which goes to latch 270 to free multiplier 262 and shifter 264, so as to allow them to work on another set of samples. The output of latch 270, in sign magnitude format for multiplication purposes, is now 16-bits long and is converted to 2's complement format at 272, a format suitable for subsequent additions. The output of converter 272 is applied to an adder 276, the adder output goes to PARAM 278 under control of the PARAM address generator and the PARAM read/write signal, and the PARAM output goes to a latch 274. The PARAM, adder and the latch form an accumulator. Thus for a type A filter 500, the 34 partial accumulations for a sample are sequentially stored in the PARAM 278. The inputs to adder 276 are always the current product sample and the previous partial accumulation product stored in PARAM 278 and latch 274. When the partial accumulation is for the last product of the filter, the output of adder 276 is accepted by an automatic gain control (AGC) network 282 and an AGC shifter 280. For a block of 1024 output samples from the adder 276 the AGC accumulates two independent items for each filter. The AGC 282 accumulates the number of one's that occur in the most significant bit (MSB) of the data word for the corresponding filters and accumulates the number of overflows that occur in adder 276 for these filters. At the end of 1024 output samples, if there are accumulated 16 or more overflows of adder 276, the gain of the data words is reduced by a factor of two, i.e., AGC shifter 280 shifts the sample word one bit toward the least significant bit (LSB). If there were fewer than four one's accumulated in the MSB position of the data word, the gain of the data word is increased by a factor of two, i.e., AGC shifter 280 shifts the sample word one bit toward the MSB. The shifted output of AGC shifter 280 is one input to the adder 286, which following the addition of some random digital noise converts the 18-bit words at its input to 8-bit words. The output of adder 286 is converted from 2's complement to a sign magnitude format at 291 for use in subsequent multiplications. There is a limiter function at 291 to cause an output of all ones at an overflow. The output of converter 291 is stored in SRAM 290 under the control of the SRAM address generator and the SRAM read/write signal. If the sample belongs to that filter associated with the selected analysis range, then the cosine and sine filtered samples are also applied through latches 294 and 296 to multiplexor 298 so as to go to recirculation memory 64 (FIG. 4) for DFT processing.

Analysis is sometimes required of signals having a center frequency of interest greater than the maximum permissible for a given spectrum analyzer, e.g., greater than 25.6 KHz. Frequency spectra up to 2 MHz can be analyzed, however, in the third mode of this spectrum translator, by using a type of an analog heterodyne translator which is an efficient and economic solution to this problem. Specifically, when the signal to be analyzed has a spectrum of interest between 25.6 KHz and 2 MHz, the band of interest is first translated, using a type of analog heterodyning translation, to a band about a selected center frequency less than 25.6 KHz (but greater than 0 Hz to avoid foldover problems at DC). The digital translation apparatus previously described is then used to digitally translate the analog translated band to a band about zero frequency.

Referring back to FIG. 6, as previously described the encoder 302 receives an input from control 51 (FIG. 4a) which is used to select one of a plurality of nine frequency bands for analysis. The selected band is encoded to provide a 4-bit binary word which addresses calculation constants ROM 308. The contents of the addressed location in ROM 308 represent limit values, two of which are the maximum and minimum selected center frequencies allowable for each of the nine possible frequency bands for analysis. A third limit value, i.e., 2 MHz, associated with each frequency range for the analog translation is also stored. A first check is now made to determine if the upper edge of the spectrum band of interest exceeds 25.6 KHz; if not, the digital translation analysis described above is performed. If, however, the upper edge of the selected band is between 25.6 KHz and 2 MHz, analog translation is first carried out, using the analog frequency synthesis technique illustrated at the bottom of FIG. 6.

Referring to FIG. 6, the output of center frequency selector 300 is applied to center frequency counter 310, where the selected center frequency is stored as a BCD formatted number. The output of counter 310 is applied to LED (light emitting diode) readout 312 to provide a numeric output. Calculation counter 314, under the direction of control and sequencer 306, is provided with the selected center frequency. In like manner calculation counter 316 receives the maximum frequency for the analog frequency analysis range, 2 MHz, which is stored in ROM 308. The contents of calculation counters 314 and 316 are compared serially. If the number in counter 314 is greater than that in counter 316, an incompatible value has been selected and the display 312 is continuously flashed to indicate an out of range condition. Otherwise, converter 320 (through multiplexor 318) receives the BCD encoded selected center frequency. For analog translation the analog portion of the frequency synthesizer increments in frequency steps of 10 KHz, as compared with 1 Hz increments in the digital translation. Therefore, multiplexor 318 must provide different portions of the (up to seven digit) selected center frequency for use in the analog synthesis and the digital synthesis. The selected center frequency is added to 2.038 MHz at counter 314. For the analog high frequency synthesizer component the three most significant digits of the sum of the selected center frequency and 2.038 MHz (the sum rounded in ten thousands) are applied to converter 320 through multiplexor 318. The binary formatted analog frequency is stored in a latch 332. Then for the digital low frequency component the four least significant digits of the selected center frequency are added to 10 KHz and applied to converter 320, to be divided by $2^{10} \times 25$ so as to provide a phase increment to accumulator 322.

For example, assume that the selected center frequency is 110 KHz. Adding the selected center frequency to 2.038 MHz gives a sum of 2.148 MHz. The first three digits of the sum, 2.14 MHz, represent the analog high frequency component. The remaining low order digit provides an 8 KHz contribution, which is added to 10 KHz for a digital low frequency component of 18 KHz. The contents of a latch 332 provide the high frequency phase increment that is applied to an accumulator 334. Accumulator 334 receives the contents of latch 332, the high frequency phase increment, at an exemplary rate of 10.24 MHz. A sample rate greater than 8.06 MHz, to satisfy the Nyquist criteria, is needed since the generated output signal may range up to 4.03 MHz. The output of accumulator 334 is applied to a complementer 336, which maintains the true and the complement value as input to sine table ROM 338. ROM 338 stores 256 8-bit words (in magnitude format) representing the trigonometric values for one quadrant of a wave cycle. The sign magnitude values from ROM 338 are converted to binary format at 340 and stored in a latch 344 to stabilize the data values. The output of latch 344 is applied to a digital-to-analog (D/A) converter 350 to provide an approximation to a continuous sine signal to be used in the analog translation illustrated in FIG. 9.

Figure 9:
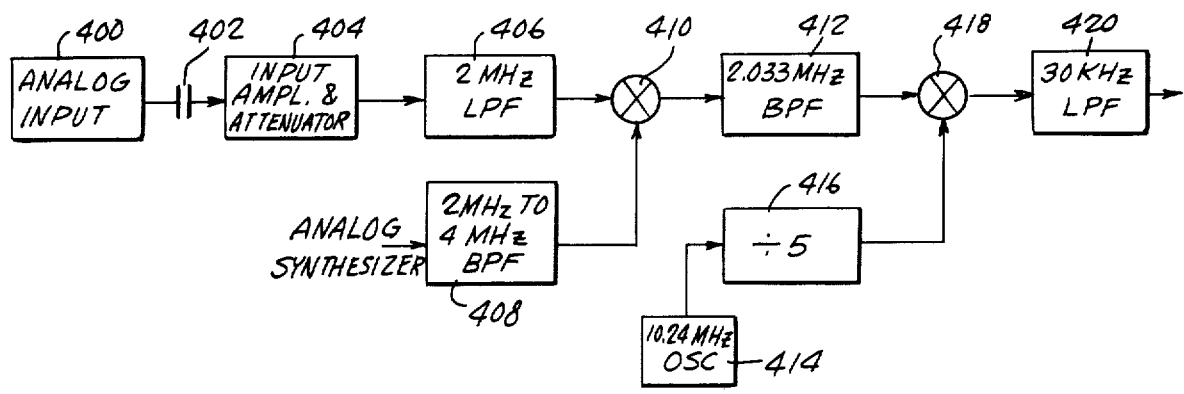
FIG. 9 is a block diagram of a portion of said spectrum analyzer used for analog translation.

Referring to FIG. 9, a high frequency analog input signal from a source 400 reaches an input amplifier and attenuator 404 through a DC isolation capacitor 402. The gain of the amplifier and attenuator 404 is controlled by input gain control 47 (FIG. 4a) of the spectrum analyzer. The output of attenuator 404 goes to an analog multiplier 410 though a low pass filter 406 having a cutoff frequency of 2 MHz. The other input to multiplier 410 is the output of D/A converter 350 (FIG. 6), which provides an approximation to the continuous sine wave applied through a 2 MHz to 4 MHz bandpass filter 408 which minimizes any imaging problems caused by spurious signals in the analog synthesis and smooths out the step transitions in the signal. The synthesizer output is a variable frequency signal from approximately 2 to 4 MHz, variable frequency signal from approximately 2 × 4 MHz, depending on the value of the selected center frequency. The output of multiplier 410 is applied to a sharp sided crystal bandpass filter 412 having a center response frequency at 2.033 MHz, with a bandpass of 10.24 KHz on each side of the selected center response frequency, to form thereby a bandpass from approximately 2.022 to 2.043 MHz. The difference signal output of bandpass filter 412 is an input to a multiplier 418. An oscillator 414 generates a square wave at a frequency of 10.24 MHz, and a divider 416 divides this 10.24 MHz oscillation by a factor of five to produce a square wave signal at a frequency of 2.048 MHz. A square wave signal may be used here since there is no concern with generation of harmonics. The difference output of multiplier 418 produces a frequency band centered about 15 KHz, with 10 KHz sidebands, or a band from approximately 5 KHz to 25 KHz. The output of multiplier 418 is applied to the input of a low pass filter 420, which has a 30 KHz cutoff. The output of filter 420 may then be applied to analog input source 20 (FIG. 4), where it is next subjected to digital translation to make it a band centered about zero frequency.

For example, using the previously assumed selected center frequency of 110 KHz, the analog synthesis value of 2.14 MHz beats with the input centered about 110 KHz to produce a difference signal centered about 2.03 MHz (2.14 MHz − 110 KHz) at the output of multiplier 410. The signal centered about 2.03 MHz passes through bandpass filter 412 and beats with the 2.048 MHz square wave. The difference output for the selected center frequency is 18 KHz (2.048 − 2.03 MHz), which passes through filter 420. Since the digital low frequency synthesizer component was 18 KHz, the selected center frequency is digitally translated to zero for digital translation prior to a spectrum analysis.

Figure 10:
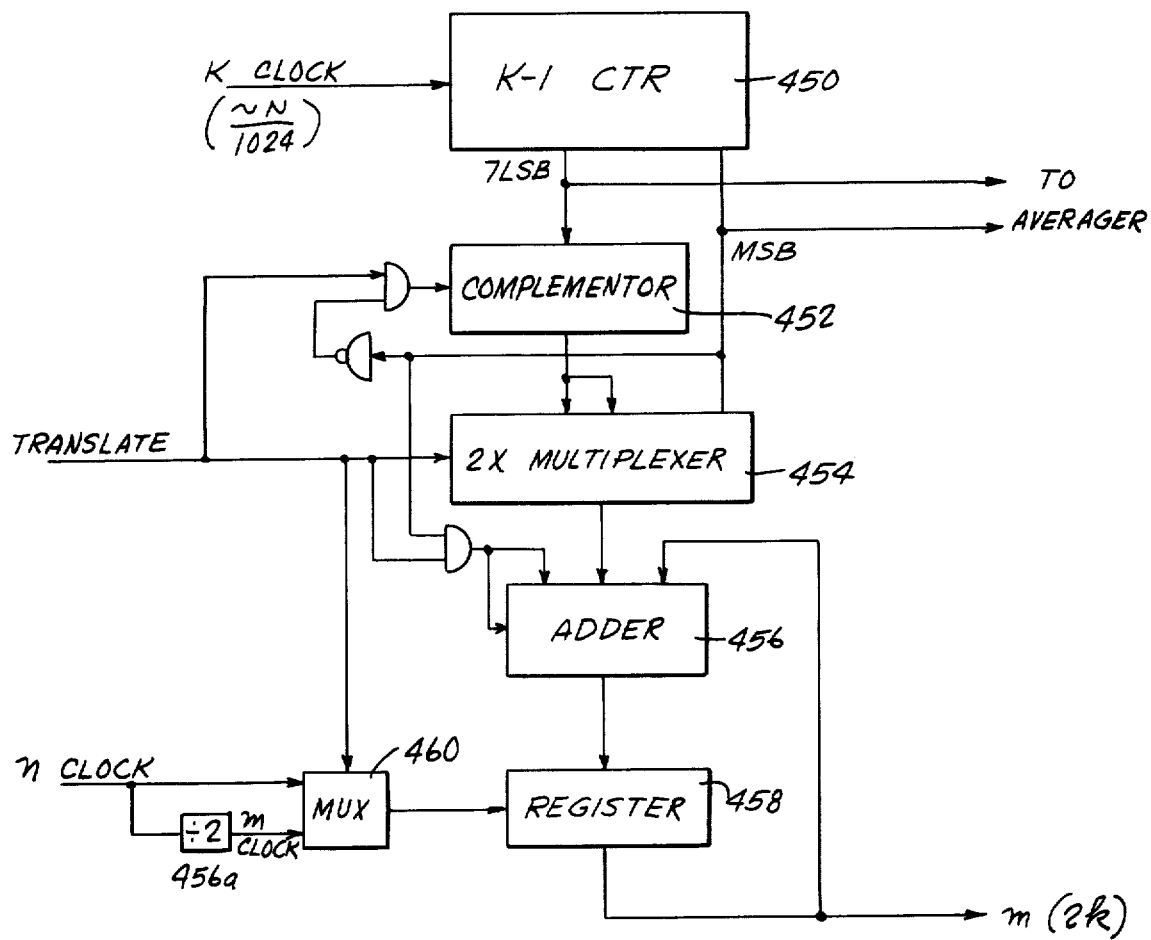
FIG. 10 is a block diagram of a portion of said spectrum analyzer used for harmonic sequence control.

In the discussion of FIGS. 4a and 4b above, the sequencing necessary to calculate the DFT for the translated sidebands was explained in part qualitatively, by function, with the understanding that any of a number of networks for this purpose can be used by one skilled in the art. One network, which has been found to be particularly suitable for sequencing certain operations in the embodiment shown in FIGS. 4a and 4b is shown in FIG. 10. Its function relates to computing the real and imaginary parts of the upper and lower translated sideband of the frequency band of interest in accordinace with the expressions:

$$RL(k) = \sum_{m=0}^{M-1} [g(2m + 1)\cos(\frac{2\pi}{M} mk) + h(2m)\sin(\frac{2\pi}{M} mk)] \quad (6)$$

$$IL(k) = \sum_{m=0}^{M-1} [g(2m + 1)\sin(\frac{2\pi}{M} mk) - h(2m)\cos(\frac{2\pi}{M} mk)]$$

$$RU(k) = \sum_{m=0}^{M-1} [g(2m + 1)\cos(\frac{2\pi}{M} mk) - h(2m)\sin(\frac{2\pi}{M} mk)]$$

$$IU(k) = \sum_{m=0}^{M-1} [g(2m = 1)\sin(\frac{2\pi}{M} mk) + h(2m)\cos(\frac{2\pi}{M} mk)]$$

In the above expressions the order k of the spectral line ranges from 0 to 127 for the lower sideband (for RL and IL), and ranges from 1 to 128 for the upper sideband (for RU and IU), so that terms are produced for a total of 256 spectral lines. All other terms in the above expressions have been defined previously. Note that the argument of g and h is the location of the word in the 1024-word recirculating memory 76 in FIG. 4a. M equals 512, so the index m ranges from 0 to 511.

Sequencing for the calculations done as indicated in FIGS. 4a and 4b and in accordance with expression (6) is provided by the network of FIG. 10, which receives a k-clock and an n-clock. The k-clock provides pulses slow enough to allow for the necessary calculations relating to one spectral line between pulses of the k-clock. The n-clock is at the word rate of the recirculating memory 76 in FIG. 4a, e.g., 2.8672 MHz. The k-clock pulses go to a counter 450, which is an 8-bit binary counter and counts from 0 to 255 (= K−1). The output of counter 450, which is an 8-bit number is used in two parts: the most significant bit (MSB) is used as a type of a weighting factor to separate the lower 7 bits into a group relating to the range from 0 to 127 and a group relating to the range from 1 to 128, so as to provide the ranges of k needed in accordance with expression (6). For the first group (when $0 \leq k \leq 127$), a complementer 452 reverses the sequence such that is output starts at 127 and decrements down to 0 so as to enable the calculation of DFT values for the spectral lines starting at the top end of the translated lower sideband and going toward the low end. (Note that for the untranslated spectrum input the sequence starts at the low frequency end of the band of interest and goes up through the center frequency.) This occurs, of course, only if a "translate" signal is on to indicate that the spectrum analyser is operating in a mode requiring frequency translation. For the second group of k-values (when MSB = 1), complenter 452 outputs a range from 0 to 127, so as to enable the calculation of DFT values for the translated upper sideband, starting with the low end of that sideband. The output of complementer 452 goes to a multiplexer 454, to be shifted one bit position toward the most significant bit, and thus multiplied by 2. The reason for this is that the required trigonometric argument being calculated as an input to ROM 80 (FIG. 4b) is $(2\pi/M)(mk)$, but ROM 80 has its arguments stored in increments of $\pi/M$, where $M = N'/2$ and $N' = 1024$, as in the spectrum analyser of said Lehmann et al. patent. The required argument, $(2\pi/M)(mk)$ is equivalent to $(2\pi/M)((m2k))$, and hence the doubling of $k$ by multiplexer 454. The $2k$ values from multiplexer 454 go to an adder 456 which has an input from a register 458 accumulating a value for $m2k$: $m$ is from an $n$-clock time-divided by 2 at 456a and $2k$ is from adder 456. The $n$-clock is the same as the clock to the ROM 80 in said Lehmann et al. patent (and $N = 2M$). The output of register 458 is thus the required value $m(2k)$. The additional input to adder 456, when the MSB of counter 450 is a 1 (indicating that the upper sideband is being processed) shifts the effective range of $k$ from 0 - 127 to 1 - 128. When there is no translation, and the spectrum analyser operates as described in said Lehmann et al. patent, and the $n$-clock goes through a multiplexer 460 directly to register 458. The MSB and the low-order 7-bits from counter 450 go to averager control 94 (FIG. 4b) to provide addressing for the 256 spectral lines.

Referring to FIG. 11, which is a partial timing sequence for the modified DFT calculations, two successive data samples, $m$ and $m + 1$, are illustrated. The data values for $h(2m)$ and $g(2m + 1)$ in the DFT memory 76 are stored in successive locations, and are to be multiplied by the appropriate trigonometric functions. The $n$-clock and the $m$-clock (which runs at one-half the rate of the $n$-clock) which were discussed with respect to FIG. 10 determine which trigonometric function is selected and the value of its associated arguement. Whenever the $n$-clock has a value of 1 the trigonometric sine function is selected; when the $n$-clock has a value of 0 the trigonometric cosine function is selected. Thus the sine and cosine trigonometric function values alternate with the value of the $n$-clock. Each sine and cosine function has an argument value of $m2\pi k/M$ dependent on the data sample number, i.e., $m$, $m + 1$, etc. Two accumulator registers, one used to accumulate the imaginary part of the product of the DFT memory 76 and the trigonometric function ROM 80 and the other to accumulate the real part of the product of the DFT memory 76 and the trigonometric function ROM 80, are used. In the DFT calculation involving translation of a selected band, the real and imaginary parts are the sum or difference of sine and cosine terms. When the difference of sine and cosine products is needed, a suitable sign inversion flag is set to indicate that the difference of the products is to be accumulated.

Thus, for example, for calculation of the imaginary part component for the lower bandpass, for a data sample $m$, a spectral line $k$, during sub-period 2, $h(2m)$ is multiplied by $\cos(2\pi mk/M)$. During sub-period 3, $g(2m + 1)$ is multiplied by $\sin(2\pi mk/M)$ and with the sign inversion flag being on, the difference of the products is accumulated in the imaginary part accumulator, this difference being represented by:

$$h(2m)\cos(2\pi mk/M) - g(2m + 1)\sin(2\pi mk/M) \qquad (7)$$

I claim:

1. A spectrum analyzer including means operative in a first analyzer mode for processing digital samples representing the time history of an analog signal to derive power spectrum values for each of a plurality of spectral lines uniformly distributed over a frequency range starting at or about zero frequency, said spectrum analyzer further including means operative in a second analyzer mode for deriving power spectrum values for spectral lines distributed only within a frequency range that does not start at zero frequency, said means operative in the second analyzer mode comprising:
    means for defining a finite frequency band of interest which starts at a non-zero frequency;
    means for providing a sequence of digital words $f(n)$, where $n = 1, 2, ..., N$, which correspond to samples of an analog signal at a sampling rate at least twice the upper limit of said band;
    means for combining each of said digital words $f(n)$ with a first and a second trigonometric function, said functions being in quadrature with respect to each other and having arguments determined by the center frequency of said band and the order of the digital word $f(n)$ in the sequence, to form respective first and second sequences of resulting digital words $g(n)$ and $h(n)$;
    means for digitally filtering the sequences of digital words $g(n)$ and $h(n)$ in accordance with a filter function determined by the width of said band to form respective sequences $g(m)$ and $h(m)$, where $m = 1, 2, ..., M$ and M is less than N;
    a discrete Fourier transform processor and means for applying thereto the digital word sequences $g(m)$ and $h(m)$ to form thereby a set of discrete Fourier transform terms RG' and IG' from each word $g(m)$ and RH' and IH' from each word $h(m)$, a set of terms being formed from each of the words $g(m)$ and $h(m)$ for each of a selected plurality of spectral lines, where R designates the real term and I the imaginary term of a discrete Fourier transform;
    means for combining the like named terms for each subscript $m$ to form respective discrete Fourier transform terms RG, IG, RH, and IH for each spectral line; and
    means for algebraically combining the terms RG, IG, RH and IH with each other to form a set of terms RU and IU representing the discrete Fourier transform of the upper half of said band translated about zero center frequency and a set of terms RL and IL representing the discrete Fourier transform of the lower half of said band translated about zero center frequency, and means for algebraically processing said terms RU, IU, RL and IL to form power spectrum values for each of said spectral lines.

2. A spectrum analyzer as in claim 1 including means operative in a third analyzer mode and comprising:
    means for receiving an analog signal having a frequency content exceeding a selected upper frequency limit;
    means for heterodyning the analog signal with a heterodyning signal at a selected frequency to produce a resultant analog signal which has a center frequency below said upper frequency limit but above zero and extends over a selected frequency band starting above zero and ending below said upper limit; and means for thereafter operating the spectrum analyzer in said second mode in which said means for defining a finite frequency band defines the frequency band of said resultant analog signal and said means for providing the sequence of words $f(n)$ provides words $f(n)$ which correspond to samples of said resultant analog signal.

3. A spectrum analyzer comprising:

means for defining a finite frequency band of interest which starts at a non-zero frequency;

means for providing a sequence of digital words $f(n)$, where $n = 1, 2, ..., N$, which correspond to samples of an analog signal at a sampling rate at least twice the upper limit of said band;

means for combining each of said digital words $f(n)$ with a first and a second trigonometric function, said functions being in quadrature with respect to each other and having arguments determined by the center frequency of said band and the order of the digital work $f(n)$ in the sequence, to form respective first and second sequences of resulting digital words $g(n)$ and $h(n)$;

means for digitally filtering the sequences of digital words $g(n)$ and $h(n)$ in accordance with a filter function determined by the width of said band to form respective sequences $g(m)$ and $h(m)$, where $m = 1, 2, ..., M$ and M is less than N;

a discrete Fourier transform processor and means for applying thereto the digital word sequences $g(m)$ and $h(m)$ to form thereby a set of discrete Fourier transform terms RG' and IG' from each word $g(m)$ and RH' and IH' from each word $h(m)$, a set of terms being formed from each of the words $g(m)$ and $h(m)$ for each of a selected plurality of spectral lines, where R designates the real term and I the imaginary term of a discrete Fourier transform;

means for combining the like named terms for each subscript $m$ to form respective discrete Fourier transform terms RG, IG, RH and IH for each spectral line;

means for algebraically combining the terms RG, IG, RH and IH with each other to form a set of terms RU and IU representing the discrete Fourier transform of the upper half of said band translated about zero center frequency and a set of terms RL and IL representing the discrete Fourier transform of the lower half of said band translated about zero center frequency, and means for algebraically processing said terms RU, IU, RL and IL to form power spectrum values for each of said spectral lines.

4. A spectrum analyzer as in claim 3 including means for receiving an analog signal having a frequency content exceeding a selected upper limit, means for heterodyning the last recited analog signal with a heterodyning signal which is at a selected frequency to derive a resultant signal which is within a range above zero but below said upper limit frequency, and means for causing said means for defining said finite band to define said resultant signal and said means for providing words $f(n)$ to provide words $f(n)$ which are samples of said resultant signal.

5. A spectrum analyzer as in claim 3 where said means for digitally filtering the sequences of digital words $g(n)$ and $h(n)$ comprises a cascade of digital finite impulse response filters and including means for directing to the discrete Fourier transform processor the output of a single one of said filters selected on the basis of a characteristic of said finite frequency band.

6. A method of carrying out spectrum analysis in a selected one of a first and a second analysis mode, said first mode including processing digital samples representing the time history of an analog signal to derive power spectrum values for each of a plurality of spectral lines uniformly distributed over a frequency range starting at or about zero frequency, and said second mode including deriving power spectrum values for spectral lines distributed only within a frequency range that does not start at zero frequency, said second mode comprising the steps of:

defining a finite frequency band of interest which starts at a non-zero frequency;

providing a sequence of digital words $f(n)$, where $n = 1, 2, ..., N$, which correspond to samples of an analog signal at a sampling rate taking into account the upper limit of said band;

combining each of said digital words $f(n)$ with a first and a second trigonometric function, said functions being in quadrature with respect to each other and having arguments determined by the center frequency of said band and the order of the digital word $f(n)$ in the sequence, to form respective first and second sequences of resulting digital words $g(n)$ and $h(n)$;

digitally filtering the sequences of digital words $g(n)$ and $h(n)$ in accordance with a filter function determined by the width of said band to form respective sequences $g(m)$ and $h(m)$, where $m = 1, 1, ..., M$ and M is less than N;

performing discrete Fourier transform processing of the digital word sequences $g(m)$ and $h(m)$ to form thereby a set of discrete Fourier transform terms RG' and IG' from each word $g(m)$ and RH' and IH' from each word $h(m)$, a set of terms being formed from each of the words $g(m)$ and $h(m)$ for each of a selected plurality of spectral lines, where R designates the real term and I the imaginary term of a discrete Fourier transform;

combining the like named terms for each subscript $m$ to form respective discrete Fourier transform terms RG, IG, RH, and IH for each spectral line; and algebraically combining the terms RG, IG, RH and IH with each other to form a set of terms RU and IU representing the discrete Fourier transform of the upper half of said band translated about zero center frequency and a set of terms RL and IL representing the discrete Fourier transform of the lower half of said band translated about zero center frequency, and algebraically processing said terms RU, IU, RL and IL to form power spectrum values for each of said spectral lines.

7. A method as in claim 6 including selectively carrying out a third analysis mode comprising the steps of:

receiving an analog signal having a frequency content exceeding a selected upper frequency limit;

heterodyning the analog signal with a heterodyning signal which is at a selected frequency to produce a resultant analog signal which is within a frequency band starting above zero and ending below said upper limit; and thereafter carrying out said second analysis mode in which said step of defining a finite frequency band includes defining the frequency range of said resultant analog signal and said step of providing the sequence of words $f(n)$ includes providing words $f(n)$ which correspond to samples of said resultant analog signal.

8. A spectrum analysis method comprising the steps of:

defining a finite frequency band of interest which starts at a non-zero frequency;

providing a sequence of digital words $f(n)$, where $n = 1, 2, ..., N$, which correspond to samples of an analog signal at a sampling rate at least twice the upper limit of said band;

combining each of said digital words $f(n)$ with a first and a second trigonometric function, said functions being in quadrature with respect to each other and having arguments determined by the center frequency of said band and the order of the digital word $f(n)$ in the sequence, to form respective first and second sequences of resulting digital words $g(n)$ and $h(n)$;

digitally filtering the sequences of digital words $g(n)$ and $h(n)$ in accordance with a filter function determined by the width of said band to form respective sequences $g(m)$ and $h(m)$, where $m = 1, 2, ..., M$ and M is less than N;

carrying out discrete Fourier transform processing of the digital word sequences $g(m)$ and $h(m)$ to form thereby a set of discrete Fourier transform terms RG' and IG' from each word $g(m)$ and RH' and IH' from each word $h(m)$, a set of terms being formed from each of the words $g(m)$ and $h(m)$ for each of a selected plurality of spectral lines, where R designates the real term and I the imaginary term of a discrete Fourier transform;

combining the like named terms for each subscript $m$ to form respective discrete Fourier transform terms RG, IG, RH and IH for each spectral line;

algebraically combining the terms RG, IG, RH and IH with each other to form a set of terms RU and IU representing the discrete Fourier transform of the upper half of said band translated about zero center frequency and a set of terms RL and IL representing the discrete Fourier transform of the lower half of said band translated about zero center frequency, and algebraically processing said terms RU, IU, RL and IL to form power spectrum values for each of said spectral lines.

9. A method as in claim 6 including the steps of receiving an analog signal having a frequency content exceeding a selected upper limit, heterodyning the last recited analog signal with a heterodyning signal which is at a selected frequency to derive a resultant signal which is within a range above zero but below said upper limit frequency, and in said defining step defining said finite band to include the frequency range of said resultant signal and in said providing step providing words $f(n)$ which are samples of said resultant signal.

10. A method as in claim 6 where said step of digitally filtering the sequences of digital words $g(nm)$ and $h(n)$ comprises successive filtering at a cascade of digital finite impulse response filters and directing for discrete Fourier transform processing the output of a single one of said filters selected on the basis of a characteristic of said finite frequency band.

* * * * *